United States Patent
Kimura et al.

(10) Patent No.: US 12,327,980 B2
(45) Date of Patent: Jun. 10, 2025

(54) SEMICONDUCTOR LASER DRIVING APPARATUS, ELECTRONIC EQUIPMENT, AND MANUFACTURING METHOD OF SEMICONDUCTOR LASER DRIVING APPARATUS

(71) Applicant: SONY SEMICONDUCTOR SOLUTIONS CORPORATION, Kanagawa (JP)

(72) Inventors: Motoi Kimura, Kanagawa (JP); Hirohisa Yasukawa, Kanagawa (JP); Nobuaki Kaji, Kanagawa (JP); Takashi Kobayashi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 700 days.

(21) Appl. No.: 17/631,977

(22) PCT Filed: Jul. 2, 2020

(86) PCT No.: PCT/JP2020/025989
§ 371 (c)(1),
(2) Date: Feb. 1, 2022

(87) PCT Pub. No.: WO2021/033439
PCT Pub. Date: Feb. 25, 2021

(65) Prior Publication Data
US 2022/0285909 A1    Sep. 8, 2022

(30) Foreign Application Priority Data
Aug. 20, 2019    (JP) .................... 2019-150229

(51) Int. Cl.
*H01S 3/00*    (2006.01)
*H01S 5/023*    (2021.01)
(Continued)

(52) U.S. Cl.
CPC .............. *H01S 5/042* (2013.01); *H01S 5/023* (2021.01); *H01S 5/02345* (2021.01);
(Continued)

(58) Field of Classification Search
CPC ...... H01S 5/042; H01S 5/023; H01S 5/02345; H01S 5/0239; H01S 5/06226;
(Continued)

(56) References Cited

U.S. PATENT DOCUMENTS

2002/0176468 A1* 11/2002 Kaneko ................ H01S 5/0264
372/50.23
2012/0287646 A1* 11/2012 Mandelboum ........ H01L 33/483
362/382

(Continued)

FOREIGN PATENT DOCUMENTS

JP    2002-353564    12/2002
JP    2007-287801    11/2007
(Continued)

OTHER PUBLICATIONS

International Search Report prepared by the Japan Patent Office on Sep. 3, 2020, for International Application No. PCT/JP2020/025989, 3 pgs.

*Primary Examiner* — Kinam Park
(74) *Attorney, Agent, or Firm* — SHERIDAN ROSS P.C.

(57) ABSTRACT

The present technique reduces the wiring inductance between a semiconductor laser and a laser driver in a semiconductor laser driving apparatus. A semiconductor laser driving apparatus includes a substrate, a laser driver, and a semiconductor laser. The substrate incorporates the laser driver. The semiconductor laser has at least one light emitting point. The semiconductor laser is mounted on one surface of the substrate in such a manner that an electrode of the light emitting point and a pattern of the substrate are
(Continued)

connected to each other via a bump. Connection wiring electrically connects the laser driver and the semiconductor laser to each other with a wiring inductance of 0.5 nanohenries or less. A sealing portion seals a connection terminal portion of the semiconductor laser for the substrate.

20 Claims, 23 Drawing Sheets

(51) Int. Cl.
  *H01S 5/02345* (2021.01)
  *H01S 5/0239* (2021.01)
  *H01S 5/042* (2006.01)
  *H01S 5/062* (2006.01)
  *H01S 5/183* (2006.01)
  *H01S 5/42* (2006.01)
  *H01S 5/02* (2006.01)
  *H01S 5/0234* (2021.01)

(52) U.S. Cl.
  CPC ........ *H01S 5/0239* (2021.01); *H01S 5/06226* (2013.01); *H01S 5/18305* (2013.01); *H01S 5/423* (2013.01); *H01S 5/0208* (2013.01); *H01S 5/0234* (2021.01); *H01S 5/0428* (2013.01)

(58) Field of Classification Search
  CPC .... H01S 5/18305; H01S 5/423; H01S 5/0208; H01S 5/0234; H01S 5/0428
  See application file for complete search history.

(56) References Cited

U.S. PATENT DOCUMENTS

| | | | |
|---|---|---|---|
| 2014/0327902 A1* | 11/2014 | Giger | G01S 17/08 356/5.01 |
| 2018/0278011 A1* | 9/2018 | Galvano | G01S 7/4813 |
| 2019/0293764 A1* | 9/2019 | Van Nieuwenhove | H01S 5/423 |
| 2020/0278426 A1* | 9/2020 | Dummer | H01S 5/06835 |
| 2021/0143607 A1* | 5/2021 | Yasukawa | H01S 5/026 |

FOREIGN PATENT DOCUMENTS

| | | |
|---|---|---|
| JP | 2009-170675 | 7/2009 |
| JP | 2014-093463 | 5/2014 |
| JP | 2014-514781 | 6/2014 |
| JP | 2016-027630 | 2/2016 |
| WO | WO 2018/10082 | 6/2018 |

* cited by examiner

FIG. 5
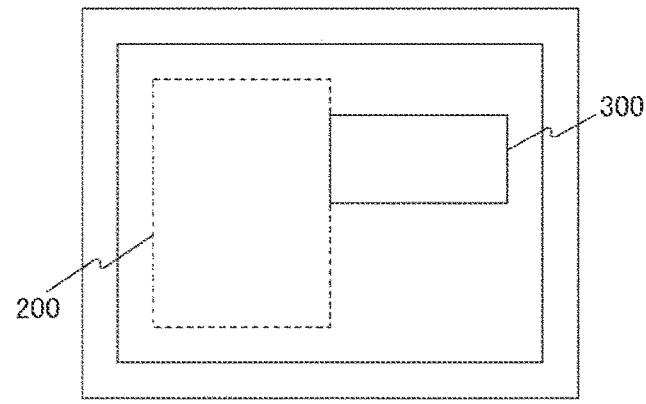
a   OVERLAP: 0%
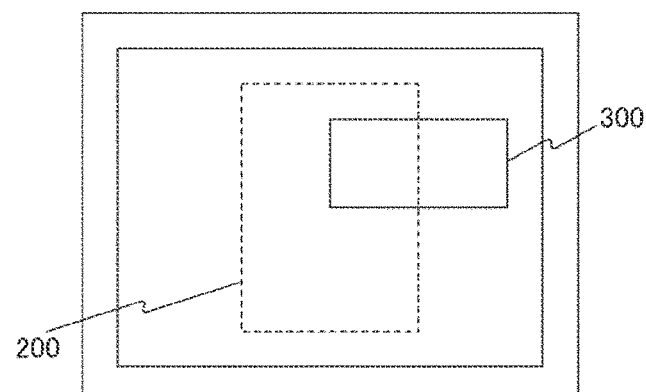
b   OVERLAP: 50%
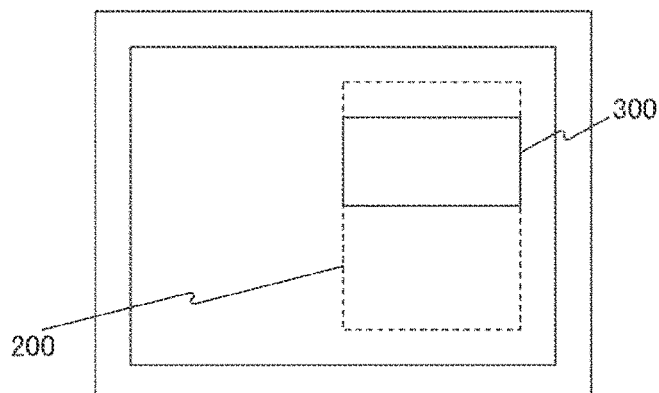
c   OVERLAP: 100%

FIG.6

ADDITIVE METHOD (H=15μm)

|   |         | L       |         |       |       |       |
|---|---------|---------|---------|-------|-------|-------|
|   |         | 0.3mm   | 0.5mm   | 1mm   | 2mm   | 3mm   |
| W | 0.015mm | 0.21    | 0.40    | 0.94  | 2.16  | 3.48  |
|   | 0.05mm  | 0.16    | 0.33    | 0.79  | 1.85  | 3.02  |
|   | 0.1mm   | 0.13    | 0.27    | 0.68  | 1.63  | 2.69  |
|   | 0.2mm   | 0.09    | 0.21    | 0.56  | 1.39  | 2.33  |
|   | 0.3mm   | 0.07    | 0.17    | 0.48  | 1.24  | 2.11  |

FIG.7

SUBTRACTIVE METHOD (H=35μm)

| | | L | | | | |
|---|---|---|---|---|---|---|
| | | 0.3mm | 0.5mm | 1mm | 2mm | 3mm |
| W | 0.035mm | 0.16 | 0.32 | 0.77 | 1.82 | 2.98 |
| | 0.05mm | 0.15 | 0.30 | 0.73 | 1.75 | 2.86 |
| | 0.1mm | 0.12 | 0.25 | 0.65 | 1.57 | 2.59 |
| | 0.2mm | 0.09 | 0.20 | 0.54 | 1.35 | 2.27 |
| | 0.3mm | 0.07 | 0.17 | 0.47 | 1.22 | 2.07 |

FIG. 8
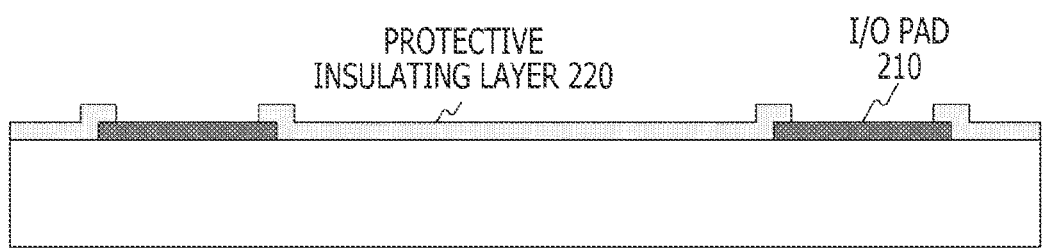
a
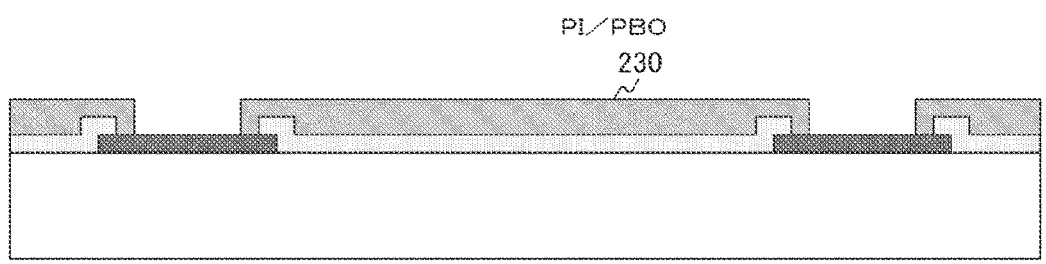
b
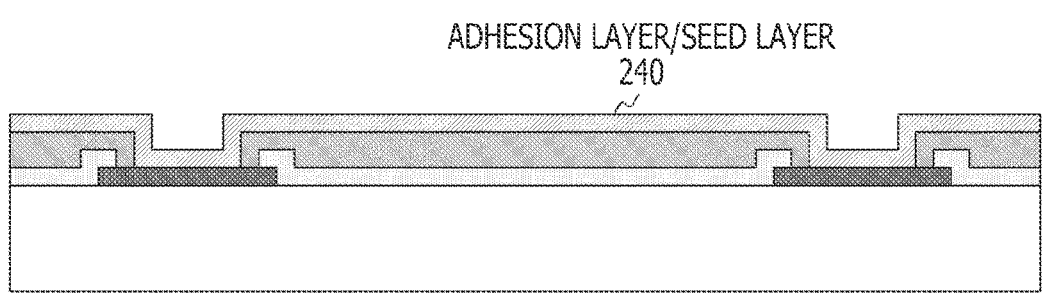
c

FIG. 9
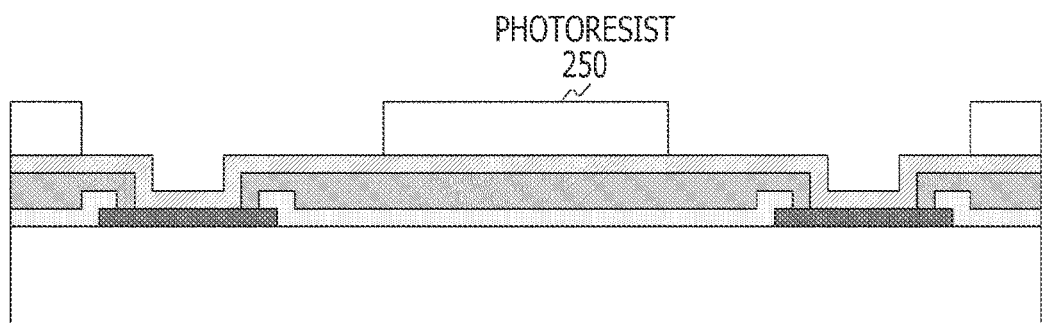
d
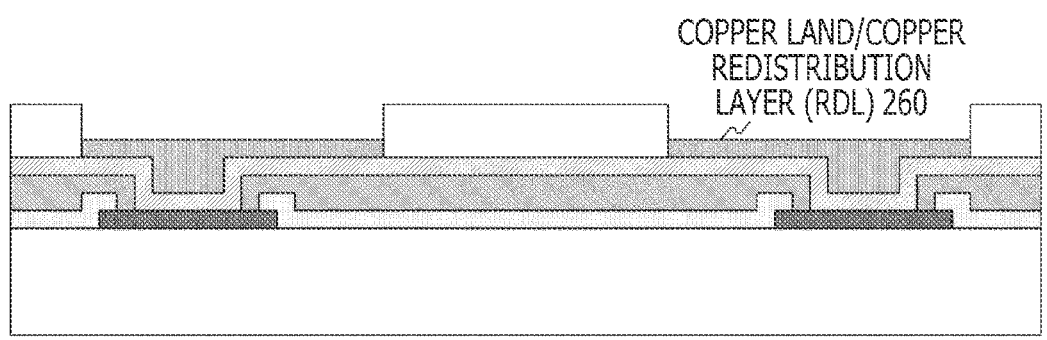
e
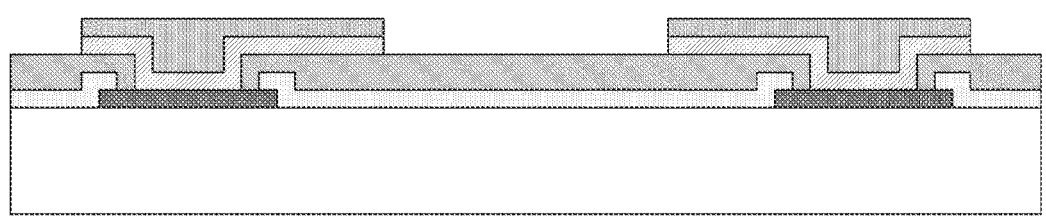
f

FIG.11
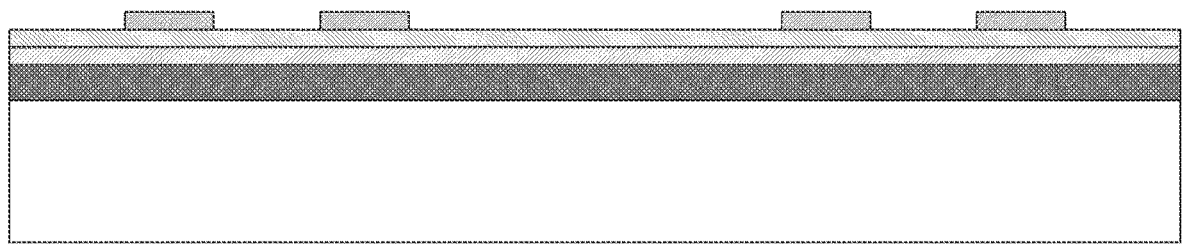
e
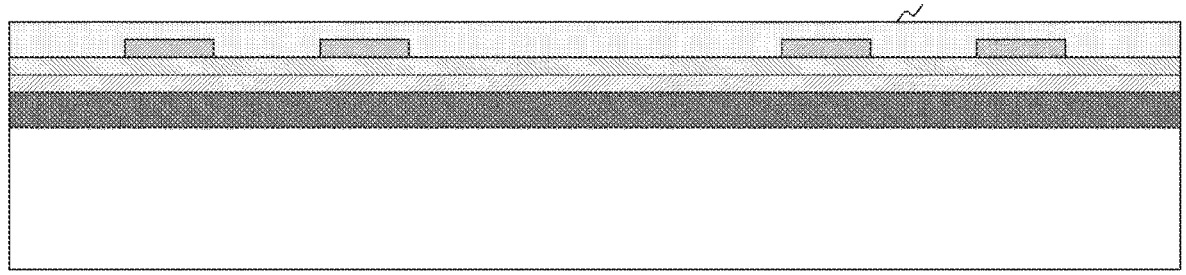
INTERLAYER
INSULATING RESIN
161
f
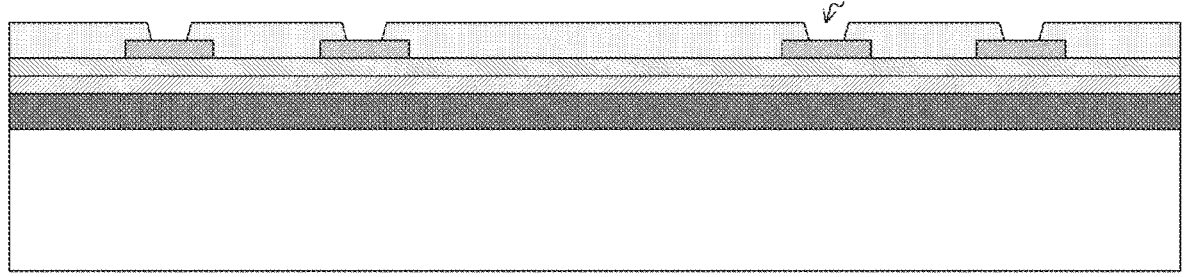
VIA HOLE 170
g
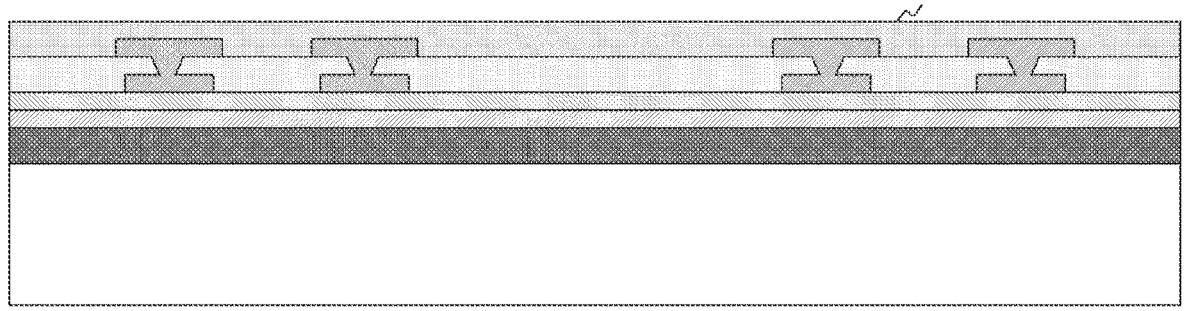
INTERLAYER
INSULATING RESIN
162
h FIG.12
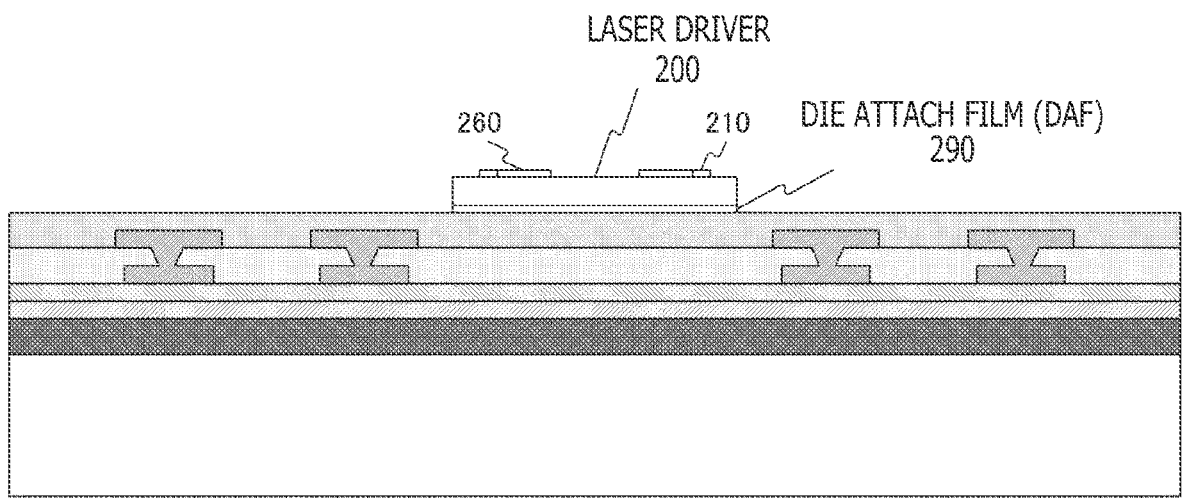
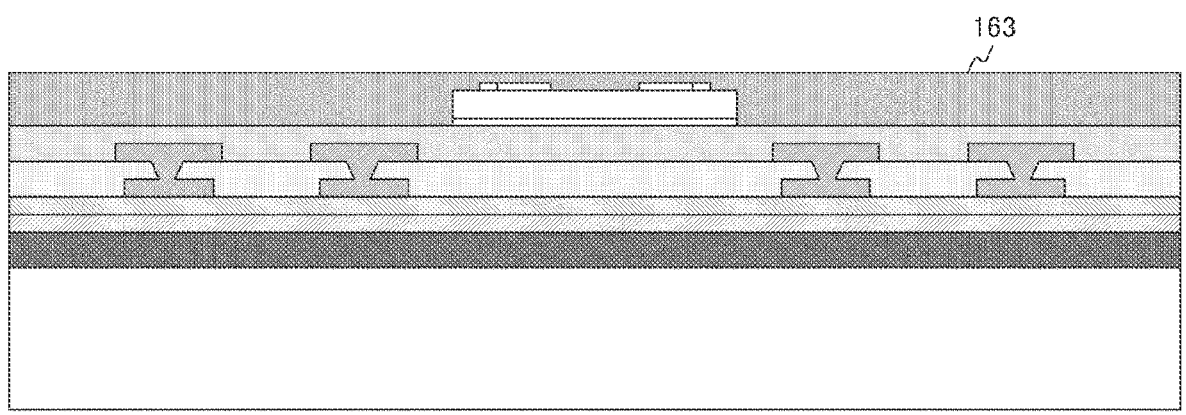
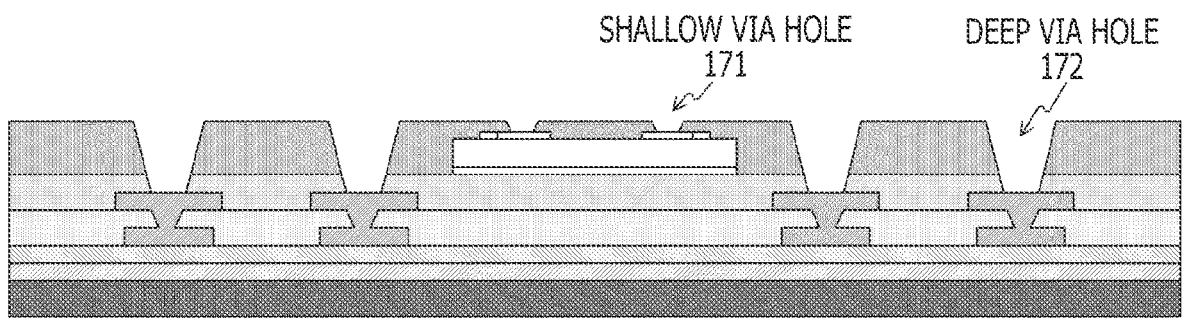

FIG.13
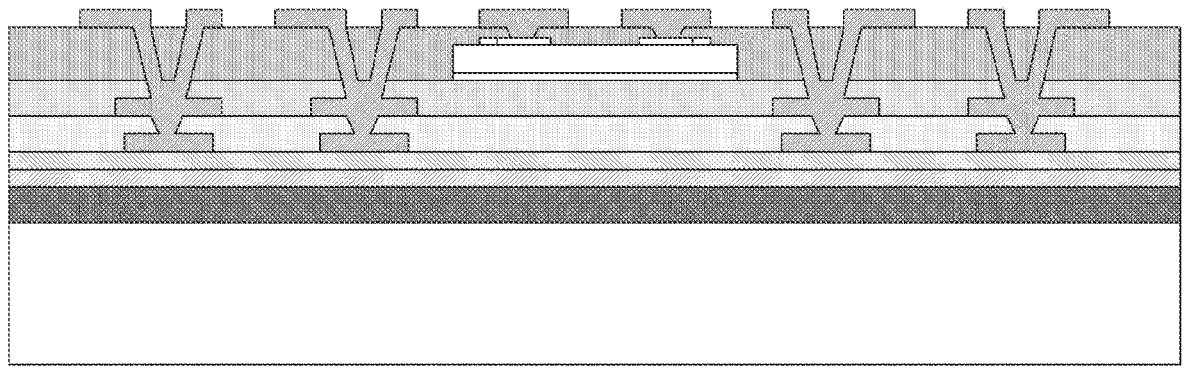
l
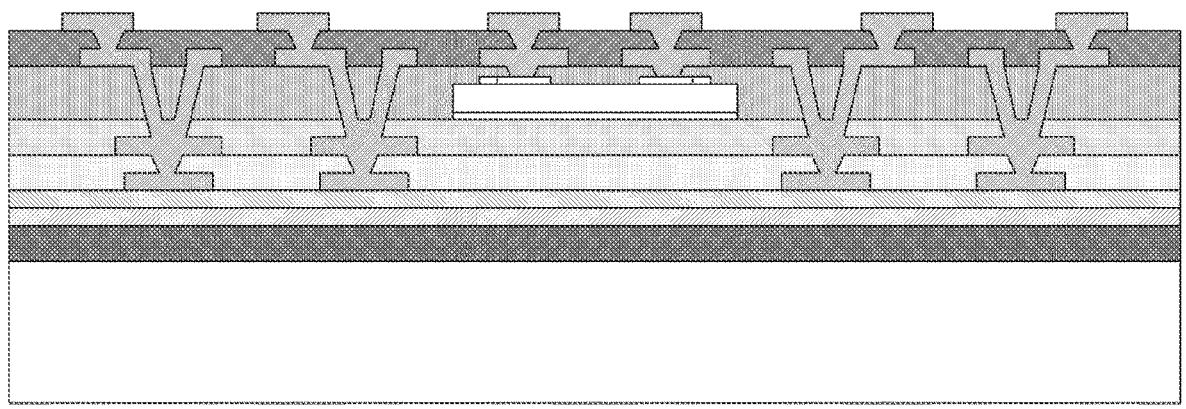
m
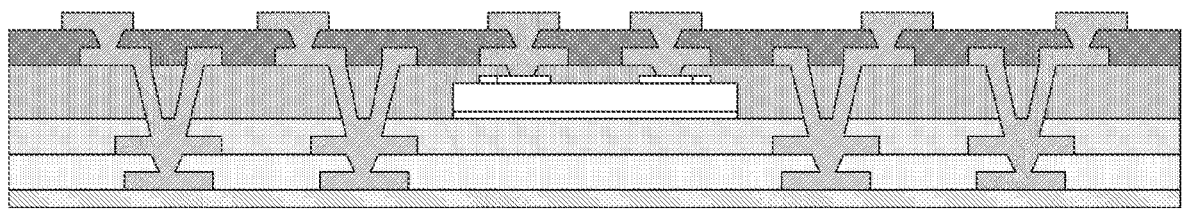
n

SEMICONDUCTOR LASER DRIVING APPARATUS, ELECTRONIC EQUIPMENT, AND MANUFACTURING METHOD OF SEMICONDUCTOR LASER DRIVING APPARATUS

CROSS REFERENCE TO RELATED APPLICATIONS

This application is a national stage application under 35 U.S.C. 371 and claims the benefit of PCT Application No. PCT/JP2020/025989, having an international filing date of 2 Jul. 2020, which designated the United States, which PCT application claimed the benefit of Japanese Patent Application No. 2019-150229, filed 20 Aug. 2019, the entire disclosures of each of which are incorporated herein by reference.

TECHNICAL FIELD

The present technique relates to a semiconductor laser driving apparatus. Specifically, the present technique relates to a semiconductor laser driving apparatus and electronic equipment including a substrate incorporating a laser driver and a semiconductor laser and a manufacturing method of the semiconductor laser driving apparatus.

BACKGROUND ART

In an electronic apparatus having a distance measurement function, a distance measurement system called ToF (Time of Flight) has often been used from the past. ToF is a system in which a light emitting unit irradiates an object with irradiation light of a sine wave or a rectangular wave, a light receiving unit receives the reflected light from the object, and a distance measurement computing unit measures a distance on the basis of a phase difference between the irradiation light and the reflected light. In order to realize such a distance measurement function, there is known an optical module in which a light emitting element and an electronic semiconductor chip for driving the light emitting element are housed in a case and integrated. For example, an optical module that includes a laser diode array mounted in alignment on an electrode pattern of a substrate and a driver IC electrically connected to the laser diode array has been proposed (refer to, for example, PTL 1).

CITATION LIST

Patent Literature

PTL 1

Japanese Patent Laid-open No. 2009-170675

SUMMARY

Technical Problems

In the related art described above, the laser diode array and the driver IC are integrated and configured as an optical module. However, in the related art, the laser diode array and the driver IC are electrically connected to each other by plural wires, the wiring inductance therebetween becomes large, and there is a risk that the drive waveform of the semiconductor laser is distorted. This is particularly problematic for ToF driven at hundreds of megahertz.

The present technique has been developed in view of such a situation, and an object thereof is to reduce a wiring inductance between a semiconductor laser and a laser driver in a semiconductor laser driving apparatus.

Solution to Problems

The present technique has been made in order to solve the above-described problems, and a first aspect thereof is to provide a semiconductor laser driving apparatus including a substrate incorporating a laser driver, a semiconductor laser that has at least one light emitting point and that is mounted on one surface of the substrate in such a manner that an electrode of the light emitting point and a pattern of the substrate are connected to each other via a bump, and connection wiring that electrically connects the laser driver and the semiconductor laser to each other with a wiring inductance of 0.5 nanohenries or less and electronic equipment including the semiconductor laser driving apparatus. This leads to an effect of electrically connecting the laser driver and the semiconductor laser to each other with a wiring inductance of 0.5 nanohenries or less.

In addition, in the first aspect, the semiconductor laser can be assumed to be a rear surface emitting-type vertical cavity surface emitting laser that emits light via a substrate material of the semiconductor laser. Here, the substrate material of the semiconductor laser may be any one of an n-type semiconductor, a p-type semiconductor, or a semi-insulating semiconductor that is not doped with impurities.

In addition, in the first aspect, the semiconductor laser may include a metal layer connected to the substrate material on the light emitting point side of the substrate material, and may be mounted in such a manner that the metal layer and the pattern of the substrate are connected to each other via a bump. This leads to an effect of connecting the metal layer connected to the substrate material and the pattern of the substrate to each other via the bump.

In addition, in the first aspect, a bump that connects the substrate and the semiconductor laser may be formed using any one of gold, copper, or solder.

In addition, in the first aspect, the semiconductor laser may have plural light emitting points where either the same anode electrode or the same cathode electrode is used in common.

In addition, in the first aspect, the substrate may include a capacity for connecting a power supply line and a ground line. This leads to an effect of using the electric charge stored in the capacity as the driving current of the semiconductor laser.

In addition, in the first aspect, the laser driver may include plural independently drivable outputs and may be connected to the electrode of the light emitting point via plural electrically separated patterns on the substrate to selectively drive a specific light emitting point. This leads to an effect of selectively driving a specific light emitting point.

In addition, in the first aspect, it is desirable that the connection wiring have a length of 0.5 millimeters or less. In addition, it is more preferable that the connection wiring be 0.3 millimeters or less.

In addition, in the first aspect, the connection wiring may be provided via a connection via provided in the substrate. This leads to an effect of shortening the wiring length.

In addition, in the first aspect, the semiconductor laser may be arranged in such a manner that a part thereof overlaps an upper part of the laser driver. In this case, the semiconductor laser may be arranged in such a manner that a part corresponding to 50% or less of the area thereof overlaps the upper part of the laser driver.

In addition, a second aspect of the present technique is to provide a manufacturing method of a semiconductor laser driving apparatus, including a step of forming a laser driver on an upper surface of a support plate, a step of forming a substrate incorporating the laser driver by forming connection wiring of the laser driver, a step of, when a semiconductor laser having at least one light emitting point is mounted on one surface of the substrate in such a manner that an electrode of the light emitting point and a pattern of the substrate are connected to each other via a bump, forming connection wiring that electrically connects the laser driver and the semiconductor laser to each other via the connection wiring with a wiring inductance of 0.5 nanohenries or less, and a step of forming a sealing portion that seals a connection terminal portion of the semiconductor laser for the substrate. This leads to an effect of manufacturing the semiconductor laser driving apparatus that electrically connects the laser driver and the semiconductor laser to each other with a wiring inductance of 0.5 nanohenries or less.

BRIEF DESCRIPTION OF DRAWINGS

FIG. 5 is a diagram for illustrating a definition of an amount of overlap between the laser driver 200 and the semiconductor laser 300 according to an embodiment of the present technique.

FIG. 6 is a diagram for illustrating a numerical example of a wiring inductance with respect to a wiring length L and a wiring width W in the case where a wiring pattern is formed by an additive method.

FIG. 7 is a diagram for illustrating a numerical example of the wiring inductance with respect to the wiring length L and the wiring width W in the case where a wiring pattern is formed by a subtractive method.

FIG. 8 depicts first diagrams each illustrating an example of a process of processing a copper land and copper redistribution layer (RDL) in a manufacturing process of the laser driver 200 according to the embodiment of the present technique.

FIG. 9 depicts second diagrams each illustrating an example of a process of processing the copper land and copper redistribution layer (RDL) in the manufacturing process of the laser driver 200 according to the embodiment of the present technique.

FIG. 11 depicts second diagrams each illustrating an example of the manufacturing process of the substrate 100 according to the embodiment of the present technique.

FIG. 12 depicts third diagrams each illustrating an example of the manufacturing process of the substrate 100 according to the embodiment of the present technique.

FIG. 13 depicts fourth diagrams each illustrating an example of the manufacturing process of the substrate 100 according to the embodiment of the present technique.

DESCRIPTION OF EMBODIMENTS

Hereinafter, modes for carrying out the present technique (hereinafter, referred to as embodiments) will be described. The explanation will be given in the following order.

Figure 1:
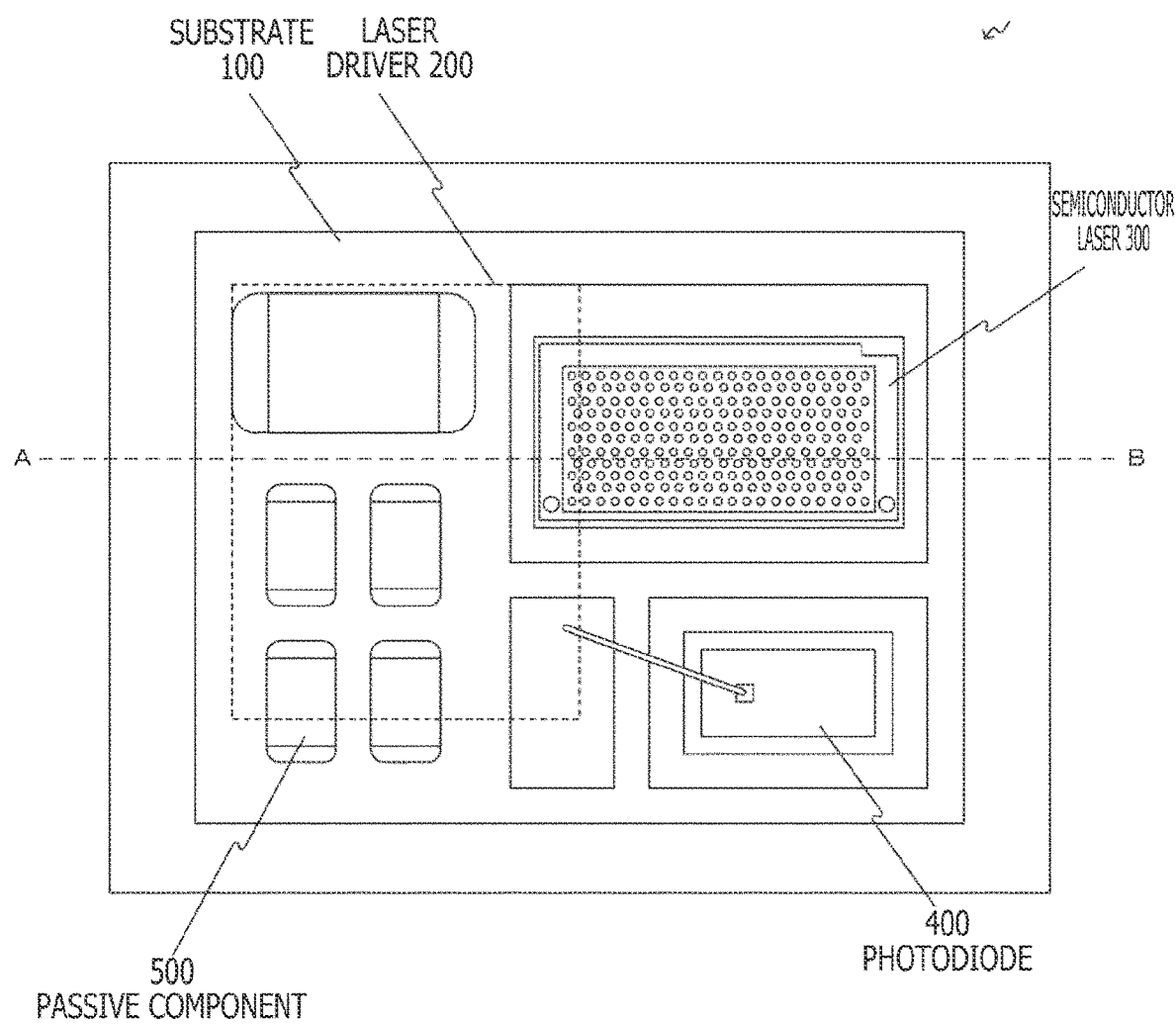
FIG. 1 is a diagram for illustrating an example of a top view of a semiconductor laser driving apparatus 10 according to an embodiment of the present technique.

1. First embodiment (example in which the same anode is used in common by light emitting points)
2. Second embodiment (example in which the same cathode is used in common by light emitting points)
3. Third embodiment (example in which connection with laser driver is provided in plural number)
4. Fourth embodiment (example in which capacity is provided between power supply and ground)
5. Modified example
6. Application example 1. First Embodiment Semiconductor Laser Driving Apparatus FIG. 1 is a diagram for illustrating an example of a top view of a semiconductor laser driving apparatus 10 according to an embodiment of the present technique.

The semiconductor laser driving apparatus 10 assumes measurement of a distance by ToF. ToF is high in depth accuracy although not as high as the structured light, and has such a characteristic that it can operate in a dark environment without any problem. In addition, ToF is considered to have many advantages as compared with other systems such as the structured light and the stereo camera in terms of the simplicity of the apparatus configuration and cost.

In the semiconductor laser driving apparatus 10, a semiconductor laser 300, a photodiode 400, and a passive component 500 are electrically connected by wire bonding and mounted on the surface of a substrate 100 incorporating a laser driver 200. As the substrate 100, a printed wiring board is assumed.

The semiconductor laser 300 is a semiconductor device that emits laser light by allowing a current to flow through a PN junction of a compound semiconductor. Here, as the compound semiconductor to be used, for example, aluminum gallium arsenide (AlGaAs), indium gallium arsenide phosphorus (InGaAsP), aluminum gallium indium phosphorus (AlGaInP), gallium nitride (GaN), and the like are assumed.

The laser driver 200 is a driver integrated circuit (IC) for driving the semiconductor laser 300. The laser driver 200 is incorporated in the substrate 100 in a face-up state. Regarding the electrical connection between the laser driver 200 and the semiconductor laser 300, since the wiring inductance needs to be reduced, it is desirable to make the wiring length as short as possible. This specific value will be described later.

The photodiode 400 is a diode for detecting light. The photodiode 400 is used for APC (Automatic Power Control) for maintaining the output of the semiconductor laser 300 constant by monitoring the light intensity of the semiconductor laser 300.

The passive component 500 is a circuit component other than active elements such as a capacitor and a resistor. The passive component 500 includes a decoupling capacitor for driving the semiconductor laser 300.

Figure 2:
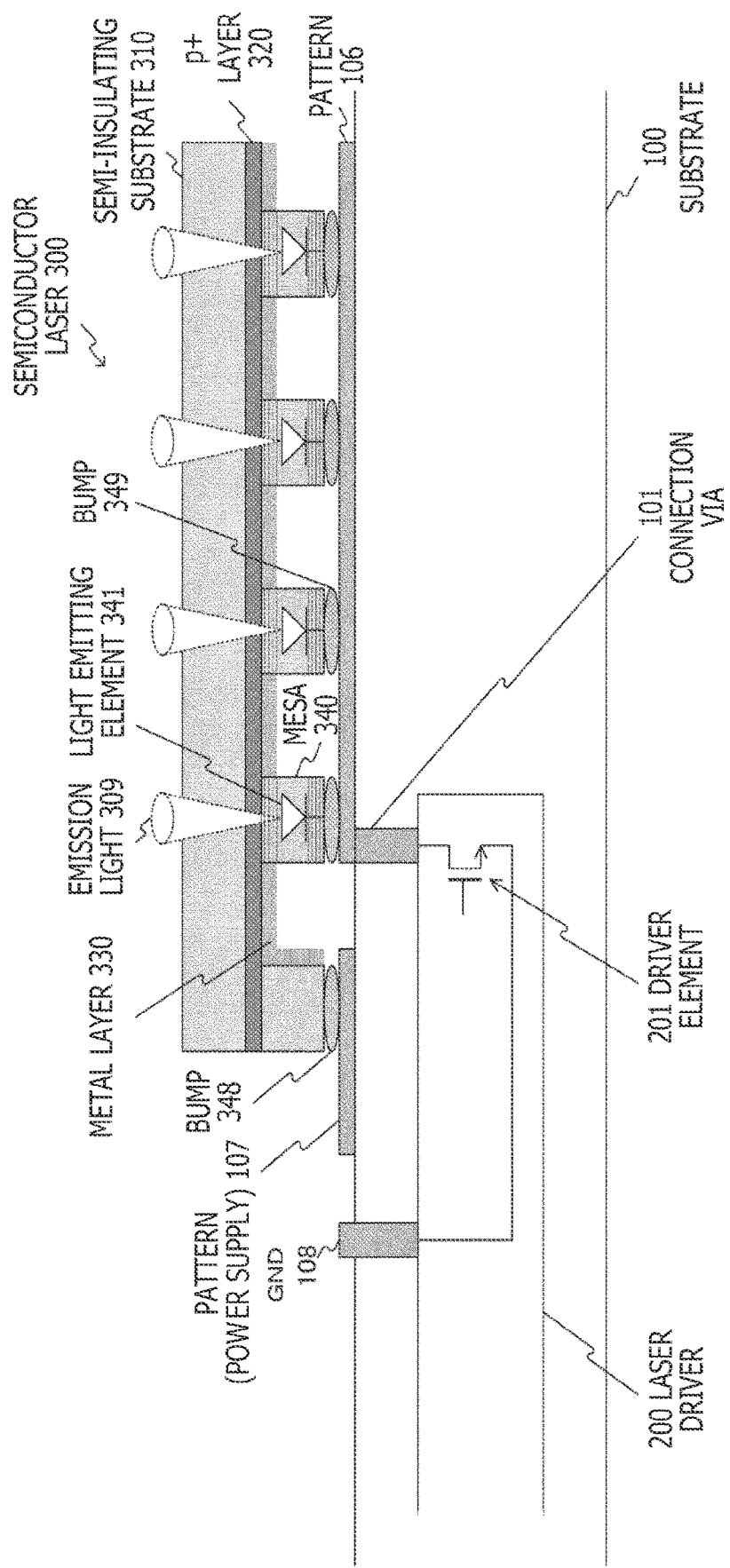
FIG. 2 is a diagram for illustrating an example of a cross-sectional view of the semiconductor laser driving apparatus 10 according to a first embodiment of the present technique.

FIG. 2 is a diagram for illustrating an example of a cross-sectional view of the semiconductor laser driving apparatus 10 according to the first embodiment of the present technique.

As described above, the substrate 100 incorporates the laser driver 200, and the semiconductor laser 300 and the like are mounted on the surface thereof. The connection between the semiconductor laser 300 and the laser driver 200 on the substrate 100 is made via a connection via 101. The wiring length can be shortened by use of the connection via 101. It should be noted that the connection via 101 is an example of the connection wiring described in the claims.

The semiconductor laser 300 is assumed to be a rear surface emitting-type vertical cavity surface emitting laser (VCSEL). The rear surface emitting-type VCSEL has a semi-insulating substrate 310 as a substrate material that is not doped with impurities, a p+ layer 320 serving as a common anode is provided thereon (below in the drawing), and light emitting points are further formed thereon (below in the drawing). The light emitting points are formed as trapezoidal mesas 340 each including a light emitting element 341. Emission light 309 from each light emitting element 341 is emitted via the semi-insulating substrate 310.

A cathode of each light emitting element 341 is connected to a signal line pattern 106 on the substrate 100 via a bump 349, and is connected to a driver element 201 of the laser driver 200 incorporated in the substrate 100, via the connection via 101. The other end of the driver element 201 is connected to a ground (GND) 108. A metal layer 330 connected to the p+ layer 320 is provided on the surface of the semi-insulating substrate 310 on the light emitting point side, and is connected to a power supply pattern 107 of the substrate 100 via a bump 348.

Here, the bumps 348 and 349 can be formed using any one of gold (Au), copper (Cu), or solder.

In the case where the metal layer 330 connected to the p+ layer 320 of the semiconductor laser 300 is connected to the substrate 100 by a bonding wire, there has been a possibility that high-speed modulation is prevented by inductance components caused by the bonding wire. In this embodiment, the semiconductor laser 300 is bump-connected to the substrate 100 incorporating the laser driver 200, and thus no bonding wire is required.

In addition, since the light emitting points of the semiconductor laser 300 are located immediately above the substrate 100 in this embodiment, heat generated at the light emitting points can be efficiently released to the substrate incorporating the components.

In addition, the substrate 100 includes a thermal via for heat radiation. Each component mounted on the substrate 100 is a heat generating source, and heat generated in each component can be radiated from the rear surface of the substrate 100 by using the thermal via.

Figure 3:
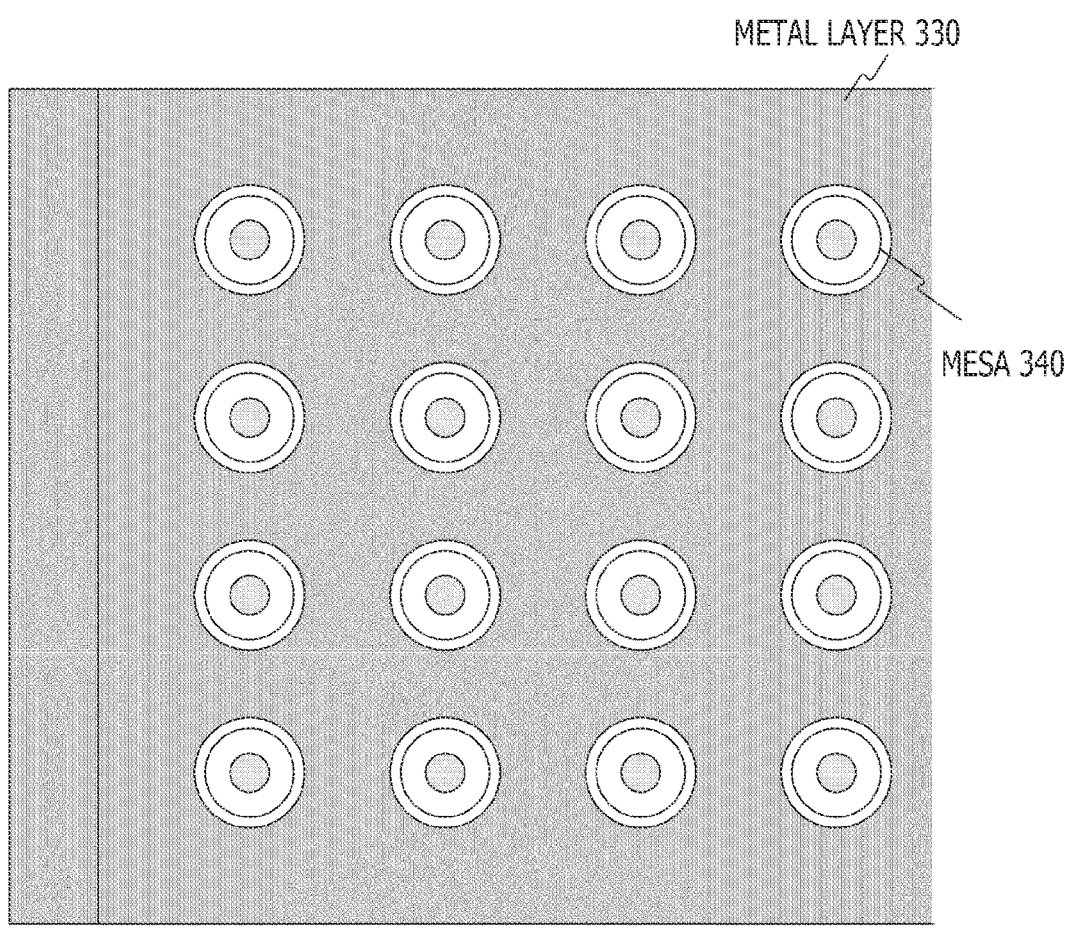
FIG. 3 is a diagram for illustrating an example of a bottom view of a semiconductor laser 300 according to the first embodiment of the present technique.

FIG. 3 is a diagram for illustrating an example of a bottom view of the semiconductor laser 300 according to the first embodiment of the present technique.

As described above, the metal layer 330 connected to the p+ layer 320 is provided on the surface of the semi-insulating substrate 310 on the light emitting point side. As illustrated in FIG. 3, the metal layer 330 is not present at the portions of the mesas 340 that are the light emitting points. At the left end of FIG. 3, the metal layer 330 is connected to the power supply pattern 107 of the substrate 100 via the bump 348.

Figure 4:
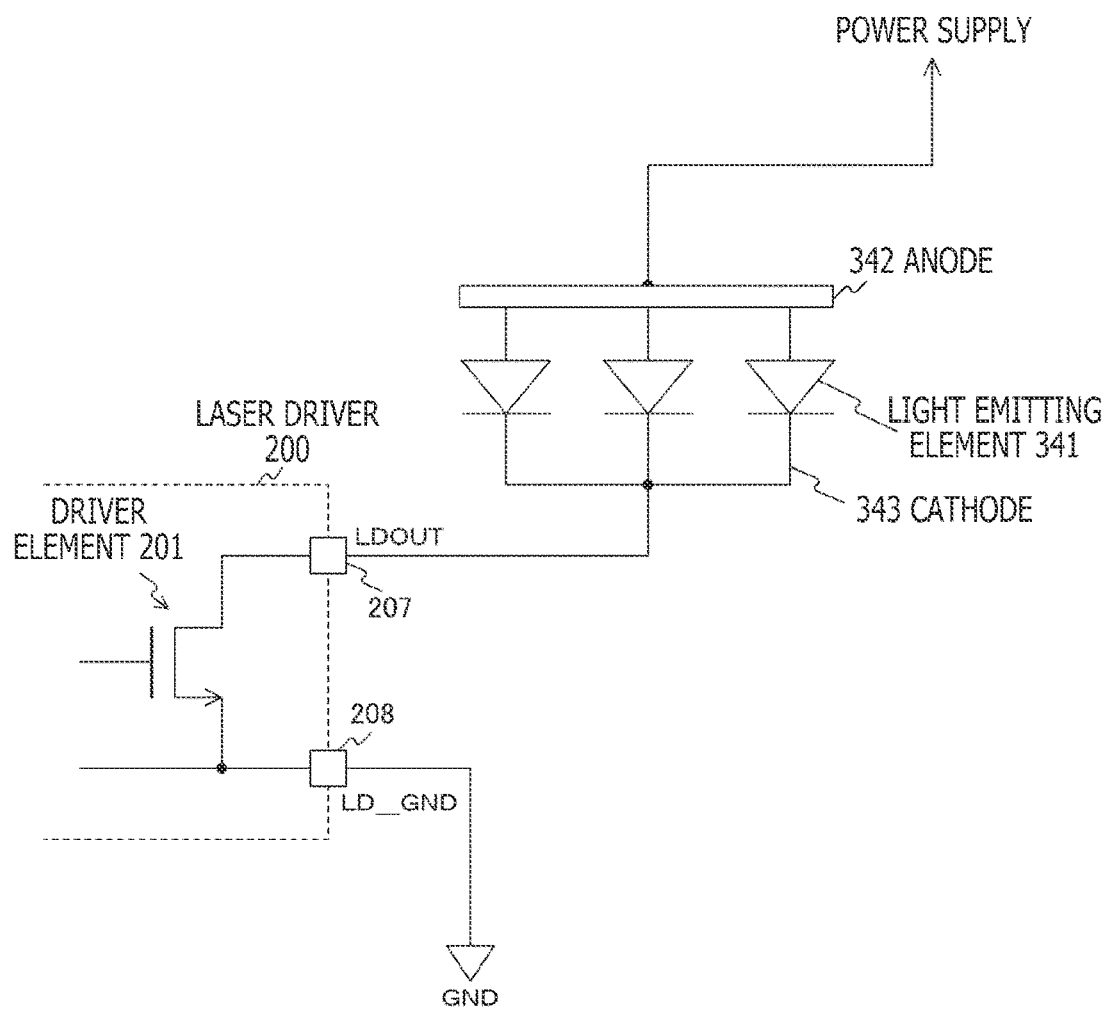
FIG. 4 is diagram for illustrating an equivalent circuit of the semiconductor laser driving apparatus 10 according to the first embodiment of the present technique.

FIG. 4 is a diagram for illustrating an equivalent circuit of the semiconductor laser driving apparatus 10 according to the first embodiment of the present technique.

An electrode of an anode 342 of the light emitting elements 341 serves as a common anode in the p+ layer 320. The p+ layer 320 is connected, from the metal layer 330, to the power supply pattern 107 of the substrate 100 via the bump 348.

On the other hand, electrodes of cathodes 343 of the light emitting elements 341 are connected to the pattern 106 on the substrate 100 via the bump 349, and are connected to an LDOUT terminal 207 of the laser driver 200 incorporated in the substrate 100, via the connection via 101. The drain of the driver element 201 is connected to the LDOUT terminal 207. An LD_GND terminal 208 is connected to the source of the driver element 201 and grounded to the ground (GND).

FIG. 5 is a diagram for illustrating the definition of an amount of overlap between the laser driver 200 and the semiconductor laser 300 in the embodiment of the present technique.

As described above, since the connection between the semiconductor laser 300 and the laser driver 200 is assumed to be made via the connection via 101, the semiconductor laser 300 and the laser driver 200 are arranged while being overlapped one on another when viewed from the upper surface. On the other hand, it is desirable to provide a thermal via 102 on the lower surface of the semiconductor laser 300, and it is also necessary to secure a region therefor. Accordingly, in order to clarify the positional relation between the laser driver 200 and the semiconductor laser 300, the amount of overlap between the two is defined as follows.

In the arrangement illustrated in a of FIG. 5, there is no overlap region between the two when viewed from the upper surface. The overlap amount in this case is defined as 0%. On the other hand, in the arrangement illustrated in c of FIG. 5, the entire semiconductor laser 300 overlaps the laser driver 200 when viewed from the upper surface. The overlap amount in this case is defined as 100%.

Then, in the arrangement illustrated in b of FIG. 5, the half region of the semiconductor laser 300 overlaps the laser driver 200 when viewed from the upper surface. The overlap amount in this case is defined as 50%.

In the embodiment, the overlap amount is desirably larger than 0% to provide a region for the above-described connection via 101. On the other hand, when considering that a certain number of thermal vias 102 are to be arranged directly under the semiconductor laser 300, the overlap amount is desirably 50% or less. Thus, by making the overlap amount larger than 0% but 50% or less, the wiring inductance is reduced, and excellent heat radiation characteristics can be obtained.

Wiring Inductance

As described above, the wiring inductance becomes a problem in the connection between the semiconductor laser 300 and the laser driver 200. All conductors have an inductive component, and even an inductance of an extremely short lead wire may cause adverse effects in high frequency regions such as a ToF system. That is, when a high frequency operation is performed, the driving waveform for driving the semiconductor laser 300 from the laser driver 200 is distorted due to the influence of the wiring inductance, and the operation may become unstable.

Here, a theoretical equation for calculating the wiring inductance is examined. For example, the inductance IDC [μH] of a straight lead wire having a circular cross section with a length L [mm] and a radius R [mm] is represented in free space by the following equation. Note that ln represents the natural logarithm.

$$IDC = 0.0002L \cdot (\ln(2L/R) - 0.75)$$

In addition, for example, the inductance IDC [μH] of a strip line (substrate wiring pattern) having a length L [mm], a width W [mm], and a thickness H [mm] is represented in free space by the following equation.

$$IDC = 0.0002L \cdot (\ln(2L/(W+H)) + 0.2235((W+H)/L) + 0.5)$$

FIG. 6 and FIG. 7 illustrate the preliminary calculation of the wiring inductance [nH] between the laser driver incorporated inside the printed wiring board and the semiconductor laser electrically connected to an upper portion of the printed wiring board.

FIG. 6 is a diagram for illustrating a numerical example of a wiring inductance with respect to a wiring length L and a wiring width W in the case where a wiring pattern is formed by an additive method. The additive method is a method of forming a pattern by depositing copper only on a necessary part of an insulating resin surface.

FIG. 7 is a diagram for illustrating a numerical example of the wiring inductance with respect to the wiring length L and the wiring width W in the case where a wiring pattern is formed by a subtractive method. The subtractive is a method of forming a pattern by etching an unnecessary part of a copper-clad laminate.

In the case of a semiconductor laser driving apparatus such as a ToF system, when assuming to drive at several hundred megahertz, the wiring inductance is desirably 0.5 nH or less, and more preferably 0.3 nH or less. Thus, when considering the above-described preliminary calculation result, it is considered that the wiring length between the semiconductor laser 300 and the laser driver 200 is desirably 0.5 millimeters or less, and more preferably 0.3 millimeters or less.

Manufacturing Method

FIG. 8 and FIG. 9 are diagrams each illustrating an example of a process of processing a copper land and copper redistribution layer (RDL) in a manufacturing process of the laser driver 200 of the embodiment of the present technique.

First, as illustrated in a of FIG. 8, an I/O pad 210 made of, for example, aluminum or the like is formed on a semiconductor wafer. Then, a protective insulating layer 220 such as SiN is deposited on the surface, and a region of the I/O pad 210 is opened.

Next, as illustrated in b of FIG. 8, a surface protective film 230 made of polyimide (PI) or polybenzoxazole (PBO) is deposited, and a region of the I/O pad 210 is opened.

Then, as illustrated in c of FIG. 8, titanium tungsten (TiW) of approximately several tens to hundreds nm and copper (Cu) of approximately 100 to 1000 nm are sequentially sputtered to form an adhesion layer and seed layer 240. Here, in addition to titanium tungsten (TiW), a refractory metal such as chromium (Cr), nickel (Ni), titanium (Ti), titanium copper (TiCu), or platinum (Pt), or an alloy thereof may be applied to the adhesion layer. Further, in addition to copper (Cu), nickel (Ni), silver (Ag), gold (Au), or an alloy thereof may be applied to the seed layer.

Subsequently, as illustrated in d of FIG. 9, a photoresist 250 is patterned in order to form a copper land and copper redistribution layer for electrical bonding. Specifically, the copper land and copper redistribution layer for electrical bonding is formed by each of processes of surface cleaning, resist coating, drying, exposure, and development.

Then, as illustrated in e of FIG. 9, a copper land and copper redistribution layer (RDL) 260 for electrical bonding is formed on the adhesion layer and seed layer 240 by a plating method. Here, as the plating method, for example, an electrolytic copper plating method, an electrolytic nickel plating method, or the like can be used. In addition, it is desirable that the diameter of the copper land be approximately 50 to 100 micrometers, the thickness of the copper redistribution layer be approximately 3 to 10 micrometers, and the minimum width of the copper redistribution layer be approximately 10 micrometers.

Next, as illustrated in f of FIG. 9, the photoresist 250 is removed, and the copper land and copper redistribution layer (RDL) 260 of the semiconductor chip is masked and dry-etched. Here, as the dry etching, for example, ion milling for applying an argon ion beam can be used. An unnecessary region of the adhesion layer and seed layer 240 can be selectively removed by the dry etching, and the copper land and copper redistribution layers are separated from each other. It should be noted that the unnecessary region can be removed by wet etching using an aqueous solution of aqua regia, cerium (TV) nitrate ammonium, or potassium hydroxide, but is desirably removed by dry etching in consideration of side etching and thickness reduction of metal layers configuring the copper land and copper redistribution layer.

FIG. 10 to FIG. 14 are diagrams each illustrating an example of a manufacturing process of the substrate 100 according to the embodiment of the present technique.

Figure 10:
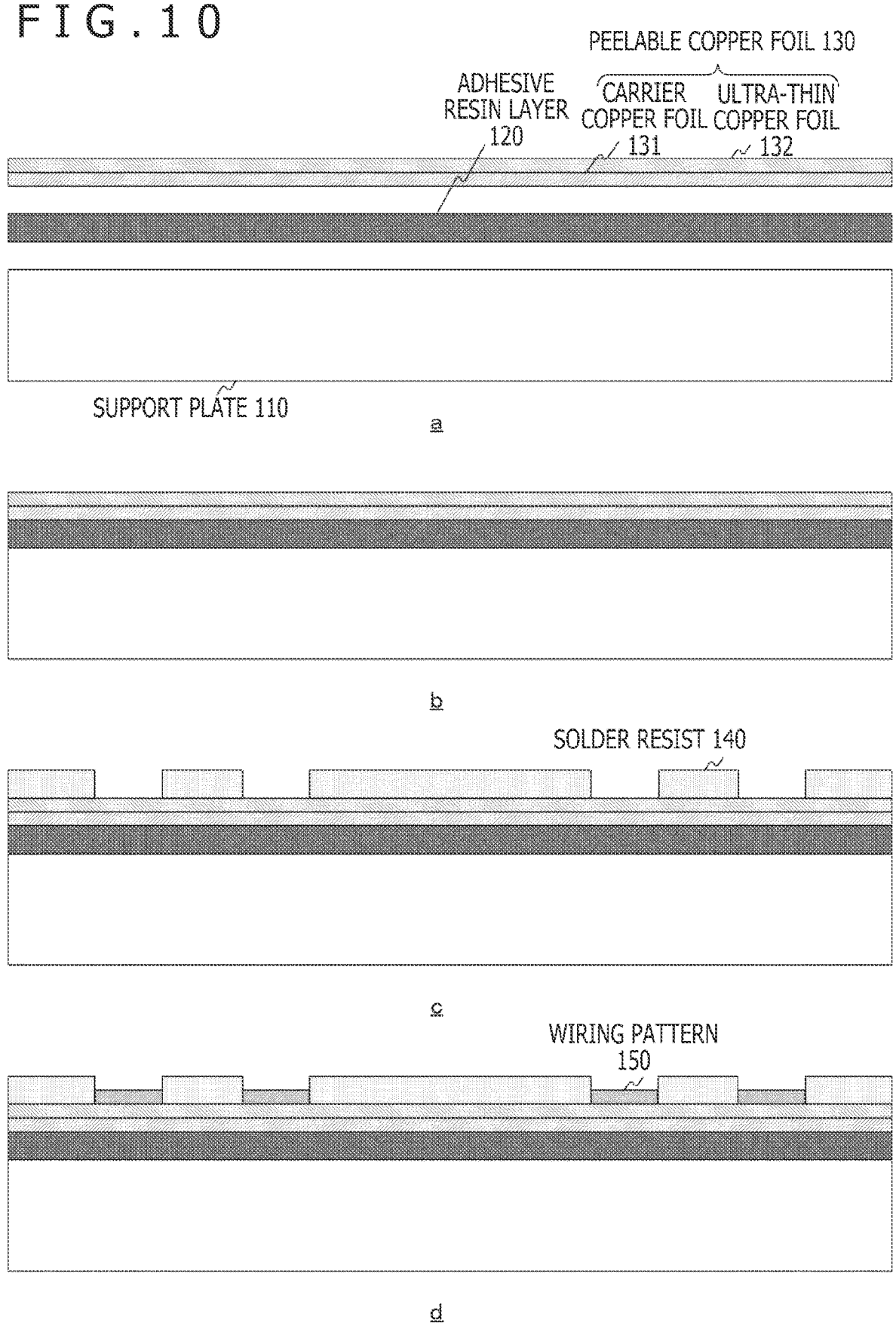
FIG. 10 depicts first diagrams each illustrating an example of a manufacturing process of the substrate 100 according to the embodiment of the present technique.

First, as illustrated in a of FIG. 10, a peelable copper foil 130 having a two-layer structure of an ultra-thin copper foil 132 and a carrier copper foil 131 is thermocompression bonded to one surface of a support plate 110 via an adhesive resin layer 120 by roll laminating or laminating press.

As the support plate 110, a substrate made of an inorganic material, a metal material, a resin material, or the like can be used. For example, silicon (Si), glass, ceramic, copper, a copper-based alloy, aluminum, an aluminum alloy, stainless steel, a polyimide resin, or an epoxy resin can be used.

The carrier copper foil 131 having a thickness of 18 to 35 micrometers is vacuum-adhered to the ultra-thin copper foil 132 having a thickness of 2 to 5 micrometers, to be used as the peelable copper foil 130. As the peelable copper foil 130, for example, 3FD-P3/35 (made by Furukawa Circuit Foil Co., Ltd.), MT-18S5DH (made by MITSUI MINING & SMELTING CO., LTD.), or the like can be used.

As a resin material of the adhesive resin layer 120, an organic resin containing a reinforcing material of a glass fiber, such as an epoxy resin, a polyimide resin, a PPE resin, a phenol resin, a PTFE resin, a silicon resin, a polybutadiene resin, a polyester resin, a melamine resin, a urea resin, a PPS resin, and a PPO resin can be used. In addition, as the reinforcing material, an aramid nonwoven fabric, an aramid fiber, a polyester fiber, or the like can be used in addition to the glass fiber.

Next, as illustrated in b of FIG. 8, a plating base conductive layer (not illustrated) having a thickness of 0.5 to 3 micrometers is formed on the surface of the ultra-thin copper foil 132 of the peelable copper foil 130 by an electroless copper plating treatment. It should be noted that, in the electroless copper plating treatment, a conductive layer is formed as a base of electrolytic copper plating for forming a wiring pattern next. However, by omitting the electroless copper plating treatment, an electrode for electrolytic copper plating may be brought into direct contact with the peelable copper foil 130, and an electrolytic copper plating treatment may be directly applied on the peelable copper foil 130 to form a wiring pattern.

Then, as illustrated in c of FIG. 10, a photosensitive resist is pasted on the surface of the support plate by roll laminating, to form a resist pattern (solder resist 140) for a wiring pattern. As the photosensitive resist, for example, a plating resist of a dry film can be used.

Subsequently, as illustrated in d of FIG. 10, a wiring pattern 150 having a thickness of approximately 15 micrometers is formed by an electrolytic copper plating treatment.

Then, as illustrated in e of FIG. 11, the plating resist is peeled off. Then, as a pretreatment for forming an interlayer insulating resin, the surface of the wiring pattern is roughened to improve the adhesion between the interlayer insulating resin and the wiring pattern. It should be noted that the roughening treatment can be performed by a blackening treatment by an oxidation/reduction treatment or a soft etching treatment using a sulfuric acid hydrogen peroxide mixture.

Next, as illustrated in f of FIG. 11, an interlayer insulating resin 161 is thermocompression bonded on the wiring pattern by roll laminating or laminating press. For example, an epoxy resin having a thickness of 45 micrometers is roll-laminated. In the case where a glass epoxy resin is used, copper foils having any thickness are superposed and thermocompression bonded by laminating press. As a resin material of the interlayer insulating resin 161, an organic resin such as an epoxy resin, a polyimide resin, a PPE resin, a phenol resin, a PTFE resin, a silicon resin, a polybutadiene resin, a polyester resin, a melamine resin, a urea resin, a PPS resin, and a PPO resin can be used. In addition, these resins alone or a combination of resins obtained by mixing plural resins or preparing a compound can be used. Further, an interlayer insulating resin obtained by containing an inorganic filler in these materials or mixing a reinforcing material of a glass fiber can also be used.

Then, as illustrated in g of FIG. 11, a via hole for interlayer electrical connection is formed by a laser method or a photoetching method. In the case where the interlayer insulating resin 161 is a thermosetting resin, the via hole is formed by a laser method. As a laser beam, an ultraviolet laser such as a harmonic YAG laser or an excimer laser or an infrared laser such as a carbon dioxide gas laser can be used. It should be noted that, in the case where the via hole is formed by a laser beam, a desmear treatment is performed because a thin resin film may remain at the bottom of the via hole. In the desmear treatment, the resin is swollen by a strong alkali, and the resin is decomposed and removed by using an oxidizing agent such as chromic acid or a permanganate aqueous solution. In addition, the resin can also be removed by a plasma treatment or a sandblasting treatment by an abrasive material. In the case where the interlayer insulating resin 161 is a photosensitive resin, the via hole 170 is formed by a photoetching method. That is, the via hole 170 is formed by development after exposure using ultraviolet rays through a mask.

Next, after the roughening treatment, an electroless plating treatment is performed on the wall surface of the via hole 170 and the surface of the interlayer insulating resin 161. Then, a photosensitive resist is pasted by roll laminating on the surface of the interlayer insulating resin 161 subjected to the electroless plating treatment. As the photosensitive resist in this case, for example, a photosensitive plating resist film of a dry film can be used. The photosensitive plating resist film is exposed and then developed, so that a plating resist pattern with the portion of the via hole 170 and the portion of the wiring pattern being opened is formed. Subsequently, the opening portions of the plating resist pattern are subjected to a treatment of applying an electrolytic copper plating having a thickness of 15 micrometers. Then, the plating resist is peeled off, and the electroless plating remaining on the interlayer insulating resin is removed by flash etching using a sulfuric acid hydrogen peroxide mixture or the like, so that the via hole 170 filled with copper plating and the wiring pattern as illustrated in h of FIG. 11 are formed. Then, the similar steps of roughening the wiring pattern and forming the interlayer insulating resin 162 are repeated.

Subsequently, as illustrated in i of FIG. 12, the laser driver 200 with a die attach film (DAF) 290 obtained by processing the copper land and copper redistribution layer with a thickness reduced to approximately 30 to 50 micrometers is mounted in a face-up state.

Then, as illustrated in j of FIG. 12, the interlayer insulating resin 163 is thermocompression bonded by roll laminating or laminating press.

Next, as illustrated in k of FIGS. 12 and 1 of FIG. 13, the via hole processing, the desmear treatment, the roughening treatment, the electroless plating treatment, and the electrolytic plating treatment similar to the above are performed. It should be noted that processing of a shallow via hole 171 for the copper land of the laser driver 200 and processing of a deep via hole 172 located one layer below, the desmear treatment, and the roughening treatment are performed simultaneously.

Here, the shallow via hole 171 is a filled via filled with copper plating. Each of the size and depth of the via is approximately 20 to 30 micrometers. In addition, the size of the diameter of the land is approximately 60 to 80 micrometers.

On the other hand, the deep via hole 172 is what is generally called a conformal via in which copper plating is applied only to the outside of the via. Each of the size and depth of the via is approximately 80 to 150 micrometers. In addition, the size of the diameter of the land is approximately 150 to 200 micrometers. It should be noted that it is desirable that the deep via hole 172 be arranged via an insulating resin of approximately 100 micrometers from the outer shape of the laser driver 200.

Next, as illustrated in m of FIG. 13, the interlayer insulating resin similar to the above is thermocompression bonded by roll laminating or laminating press. At this time, the inside of the conformal via is filled with the interlayer insulating resin. Then, the via hole processing, the desmear treatment, the roughening treatment, the electroless plating treatment, and the electrolytic plating treatment similar to the above are performed.

Subsequently, as illustrated in n of FIG. 13, the support plate 110 is separated by being peeled off from the interface between the carrier copper foil 131 and the ultra-thin copper foil 132 of the peelable copper foil 130.

Figure 14:
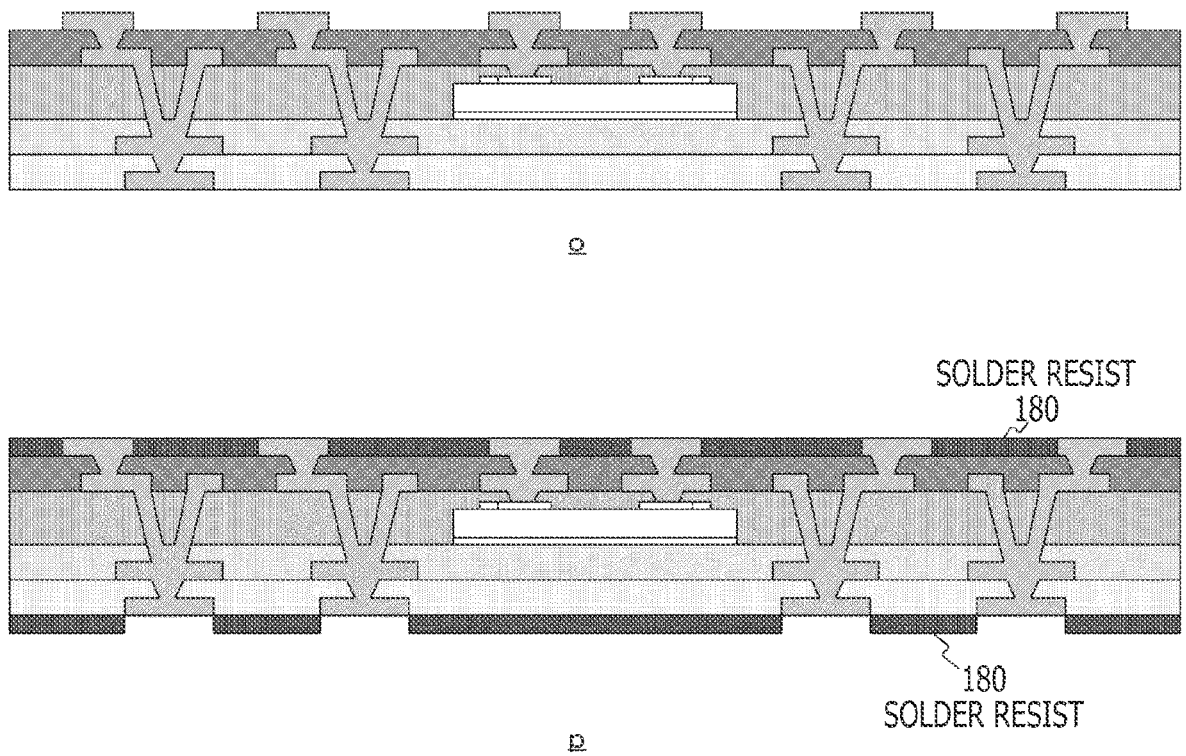
FIG. 14 depicts fifth diagrams each illustrating an example of the manufacturing process of the substrate 100 according to the embodiment of the present technique.

Then, as illustrated in o of FIG. 14, by removing the ultra-thin copper foil 132 and the plating base conductive layer with use of sulfuric acid-hydrogen peroxide-based soft etching, it is possible to obtain a component-incorporated substrate with the wiring pattern exposed.

Next, as illustrated in p of FIG. 14, a solder resist 180 of a pattern having an opening at the land portion of the wiring pattern is printed on the exposed wiring pattern. It should be noted that the solder resist 180 can be formed by a roll coater with use of a film type. Then, an electroless Ni plating of 3 micrometers or more is formed at the land portion of the opening of the solder resist 180, and an electroless Au plating of 0.03 micrometers or more is formed thereon. The electroless Au plating may be formed by one micrometer or more. Further, solder can be precoated thereon. Alternatively, an electrolytic Ni plating of 3 micrometers or more may be formed at the opening of the solder resist 180, and an electrolytic Au plating of 0.5 micrometers or more may be formed thereon. Further, other than the metal plating, an organic rust preventive film may be formed at the opening of the solder resist 180.

In addition, a BGA (Ball Grid Array) of solder balls may be mounted on the land for external connection by printing and applying cream solder as a connection terminal. In addition, as the connection terminal, a copper core ball, a copper pillar bump, a land grid array (LGA), or the like may be used.

The semiconductor laser 300, the photodiode 400, and the passive component 500 are mounted on the surface of the substrate 100 thus manufactured as described above, and side walls 600 and a diffusion plate 700 are attached thereto. In general, after performing the processing in the form of an aggregate substrate, the outer shape is processed by a dicer or the like to be separated into individual pieces.

It should be noted that, although the example of using the peelable copper foil 130 and the support plate 110 has been described in the above process, a copper clad laminate (CCL) can be used instead. In addition, as the manufacturing method of incorporating the component into the substrate, a method of forming a cavity in the substrate and mounting the same may be used.

As described above, according to the first embodiment of the present technique, the electrical connection between the semiconductor laser 300 and the laser driver 200 is made via the connection via 101, so that the wiring inductance can be reduced. Specifically, the wiring inductance can be reduced to 0.5 nanohenries or less by making the wiring length between them 0.5 millimeters or less. In addition, by making the amount of overlap between the semiconductor laser 300 and the laser driver 200 50% or less, a certain number of thermal vias can be arranged directly under the semiconductor laser 300, and excellent heat radiation characteristics can be obtained. In addition, by using the MUF 610, the outer wall of the semiconductor laser driving apparatus 10 can simultaneously be formed while the connection terminal portion of the semiconductor laser 300 is protected.

In particular, since the rear surface emitting-type VCSEL is bump-connected to the substrate incorporating the laser driver and no bonding wire is required in this embodiment, the inductance components caused by the bonding wire are suppressed to enable high-speed modulation. In addition, since no bonding wire is required, the substrate incorporating the components can be downsized.

In addition, since the light emitting points of the VCSEL are mounted close to the substrate incorporating the components in this embodiment, heat generated at the light emitting points can easily be radiated, and the temperature rise of the light emitting points can be alleviated to enable higher output.

Modified Example

Figure 15:
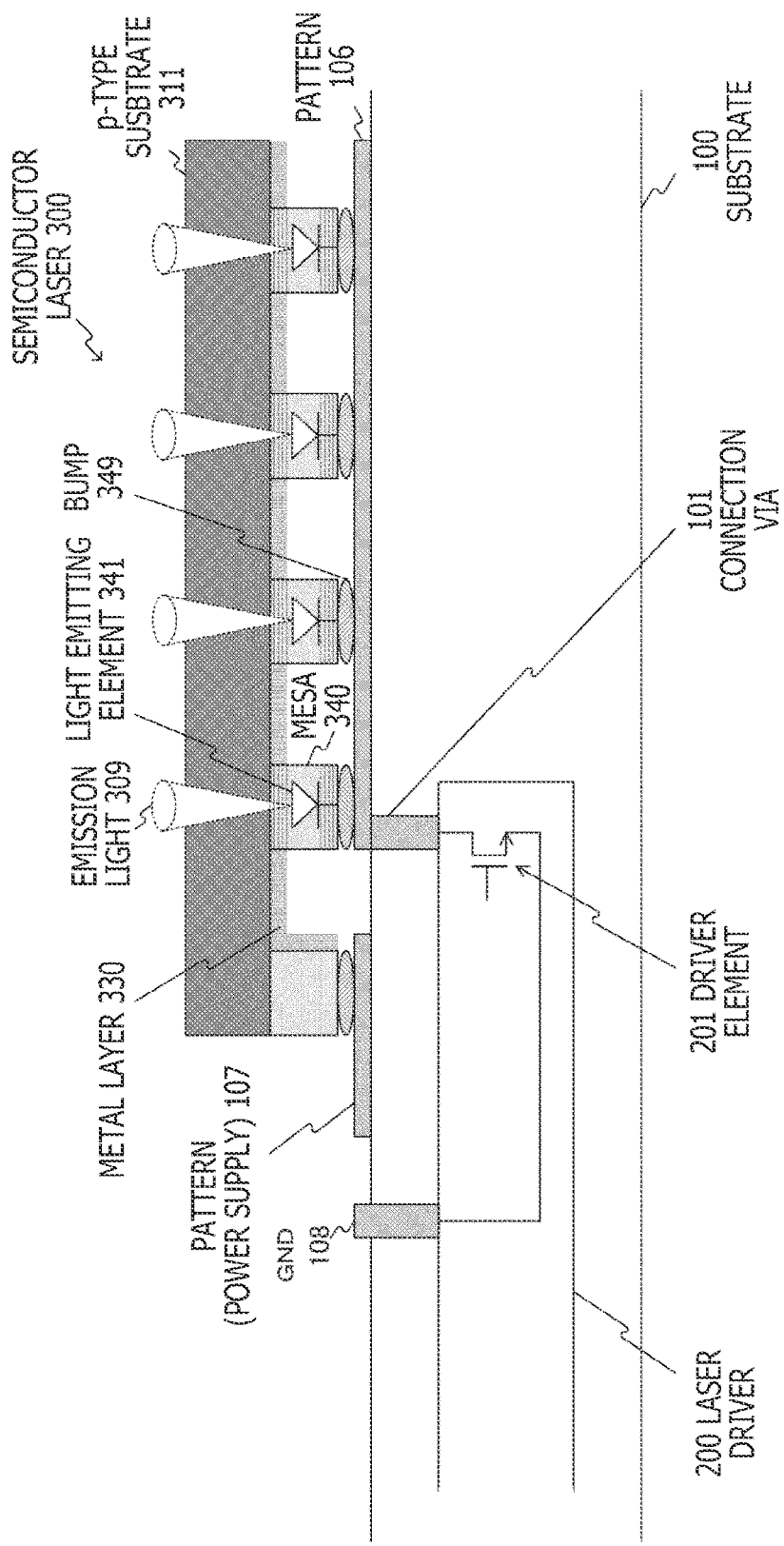
FIG. 15 is a diagram for illustrating an example of a cross-sectional view of a semiconductor laser driving apparatus 10 according to a modified example of the first embodiment of the present technique.

FIG. 15 is a diagram for illustrating an example of a cross-sectional view of a semiconductor laser driving apparatus 10 according to a modified example of the first embodiment of the present technique.

In the above-described first embodiment, the structure in which the p+ layer 320 is provided on the semi-insulating substrate 310 has been described, but the entire substrate may be formed using a p-type semiconductor. As the p-type semiconductor, for example, there is gallium arsenide (GaAs). This modified example illustrates an example of using a p-type substrate 311 formed using a p-type semiconductor. In this case, it is not necessary to separately provide the p+ layer 320.

2. Second Embodiment

In the above-described first embodiment, an example of a case in which the same anode is used in common by the light emitting points has been described, but an example of a case in which the same cathode is used in common by the light emitting points will be described in a second embodiment. It should be noted that the entire configuration as a semiconductor laser driving apparatus 10 is similar to that of the above-described first embodiment, and thus the detailed description thereof will be omitted.

Figure 16:
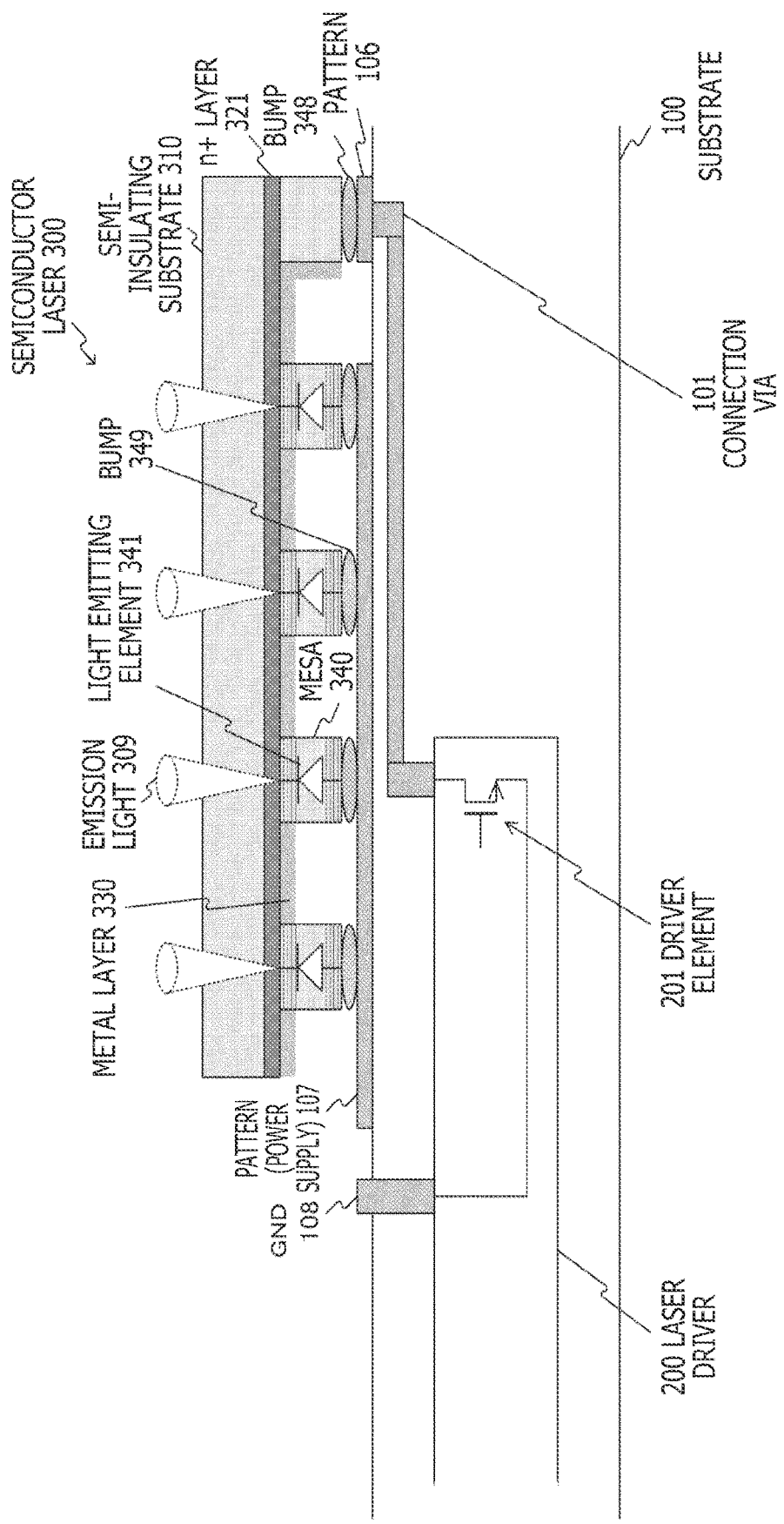
FIG. 16 is a diagram for illustrating an example of a cross-sectional view of a semiconductor laser driving apparatus 10 according to a second embodiment of the present technique.

FIG. 16 is a diagram for illustrating an example of a cross-sectional view of the semiconductor laser driving apparatus 10 according to the second embodiment of the present technique.

In the second embodiment, the semi-insulating substrate 310 is used as a substrate material in the semiconductor laser 300, an n+ layer 321 serving as a common cathode is provided thereon (below in the drawing), and the respective light emitting points are further formed thereon (below in the drawing).

The anodes of the light emitting elements 341 are connected to the power supply pattern 107 on the substrate 100 via the bump 349. The metal layer 330 connected to the n+ layer 321 is provided on the surface of the semi-insulating substrate 310 on the light emitting point side, and is connected to the pattern 106 of the substrate 100 via the bump 348. The pattern 106 is connected to the driver element 201 of the laser driver 200 incorporated in the substrate 100, via the connection via 101. The other end of the driver element 201 is connected to the ground (GND) 108.

Figure 17:
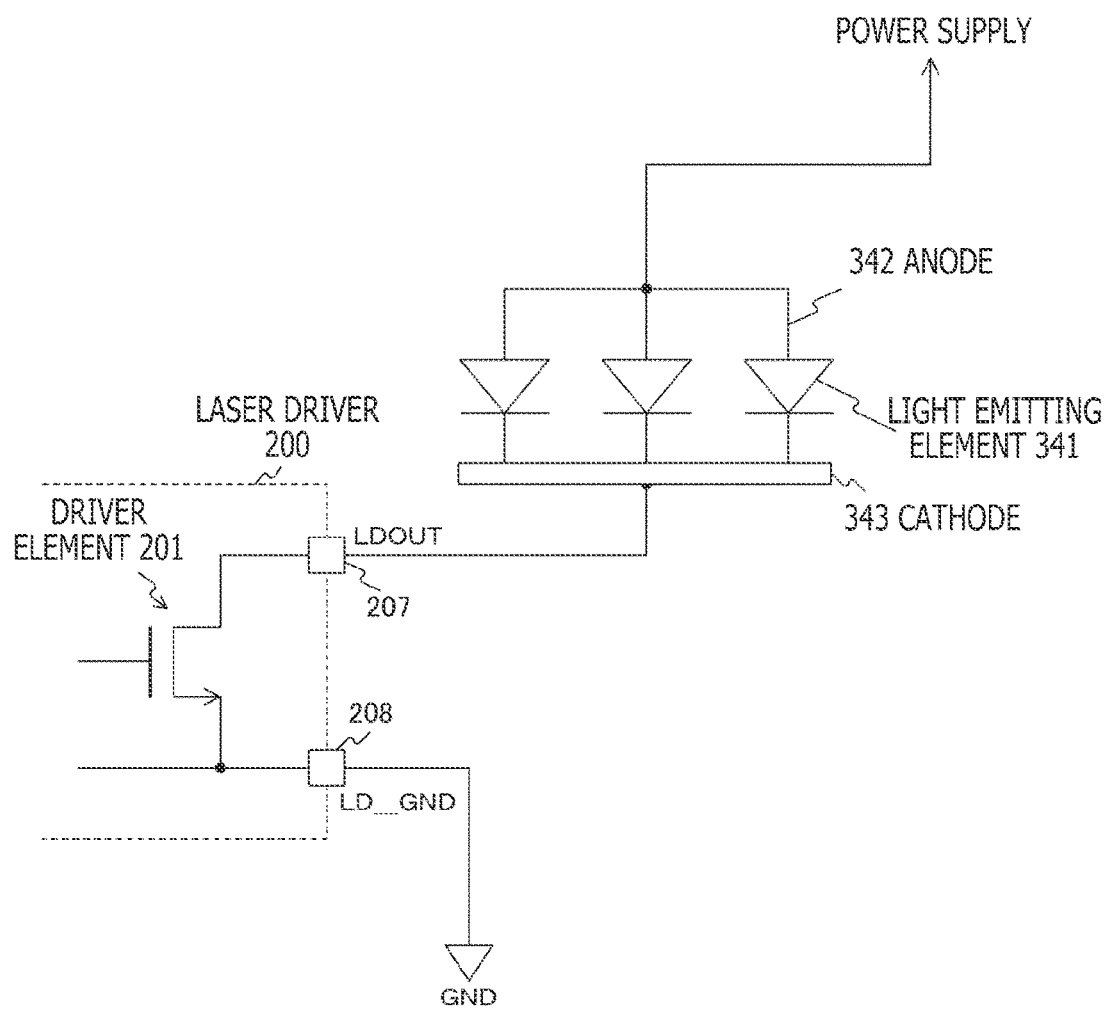
FIG. 17 is a diagram for illustrating an example of an equivalent circuit of the semiconductor laser driving apparatus 10 according to the second embodiment of the present technique.

FIG. 17 is a diagram for illustrating an equivalent circuit of the semiconductor laser driving apparatus 10 according to the second embodiment of the present technique.

The electrode of the cathode 343 of the light emitting elements 341 serves as a common cathode in the n+ layer 321. The n+ layer 321 is connected, from the metal layer 330, to the pattern 106 of the substrate 100 via the bump 348, and is connected to the LDOUT terminal 207 of the laser driver 200 incorporated in the substrate 100, via the connection via 101.

On the other hand, the electrodes of the anodes 342 of the light emitting elements 341 are connected to the power supply pattern 107 on the substrate 100 via the bump 349. The drain of the driver element 201 is connected to the LDOUT terminal 207. The LD_GND terminal 208 is connected to the source of the driver element 201 and grounded to the ground (GND).

As described above, according to the second embodiment of the present technique, even in the configuration in which the same cathode is used in common by the light emitting points, the effects similar to those of the above-described first embodiment can be obtained.

Modified Example

Figure 18:
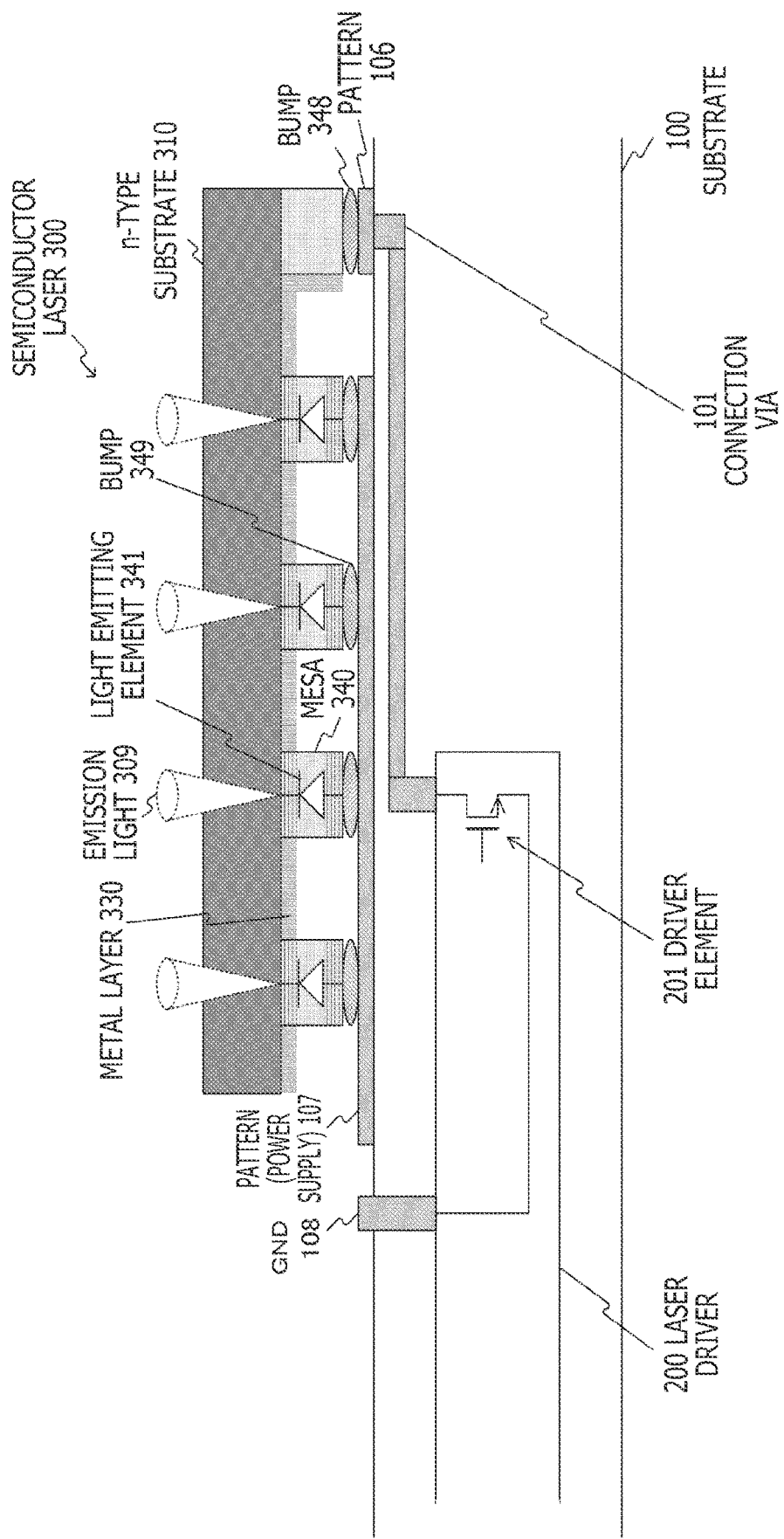
FIG. 18 is a diagram for illustrating an example of a cross-sectional view of a semiconductor laser driving apparatus 10 according to a modified example of the second embodiment of the present technique.

FIG. 18 is a diagram for illustrating an example of a cross-sectional view of a semiconductor laser driving apparatus 10 according to a modified example of the second embodiment of the present technique.

In the above-described second embodiment, the structure in which the n+ layer 321 is provided on the semi-insulating substrate 310 has been described, but the entire substrate may be formed using an n-type semiconductor. This modified example illustrates an example of using an n-type substrate 312. In this case, it is unnecessary to separately provide the n+ layer 321.

3. Third Embodiment

In the above-described first embodiment, the connection between the semiconductor laser 300 and the laser driver 200 has been one, but connection that is provided in plural number and that can be operated separately is assumed in a third embodiment. It should be noted that the entire configuration as a semiconductor laser driving apparatus 10 is similar to that of the above-described first embodiment, and thus the detailed description thereof will be omitted.

Figure 19:
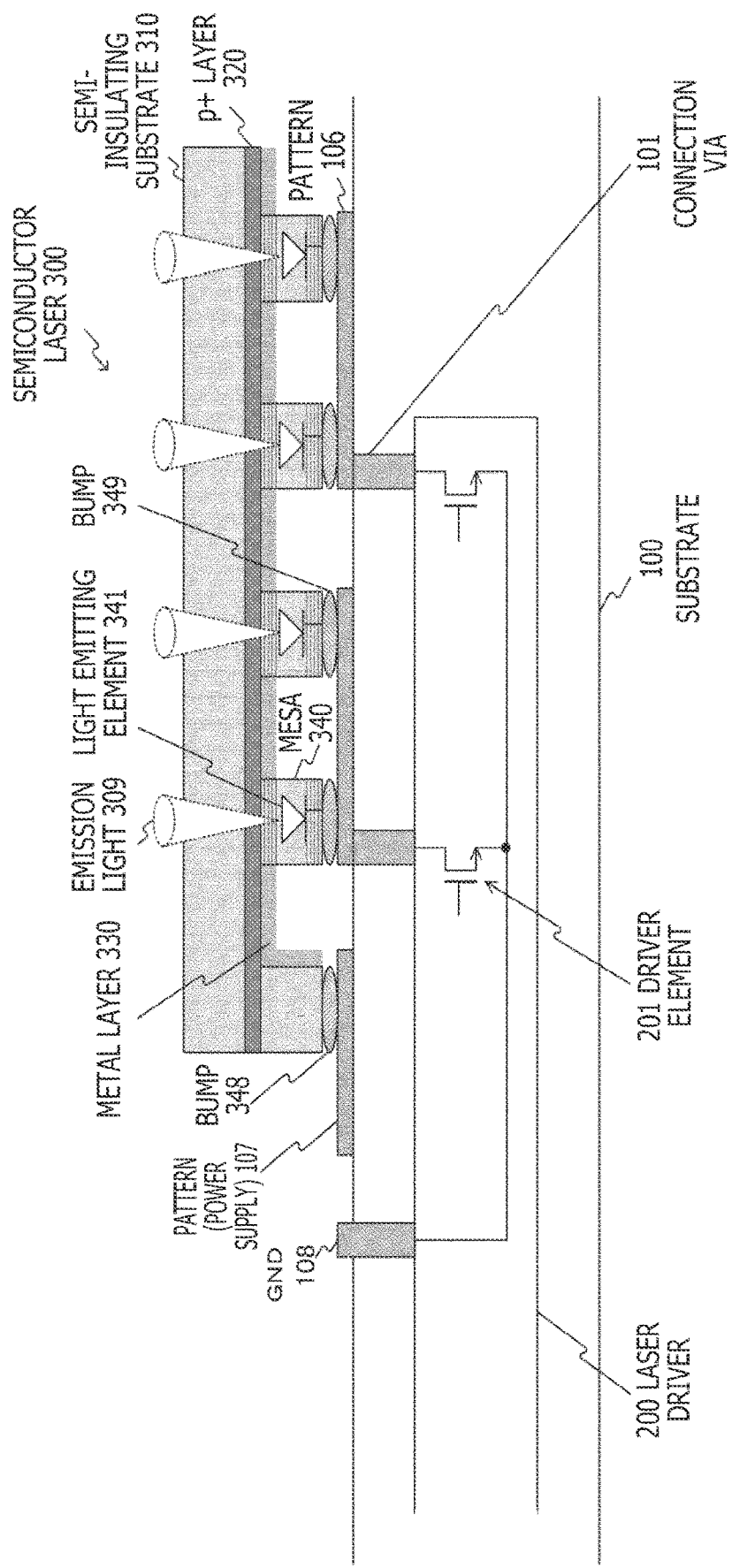
FIG. 19 is a diagram for illustrating an example of a cross-sectional view of a semiconductor laser driving apparatus 10 according to a third embodiment of the present technique.

FIG. 19 is a diagram for illustrating an example of a cross-sectional view of the semiconductor laser driving apparatus 10 according to the third embodiment of the present technique.

In the third embodiment, the same anode is used in common by the light emitting points in the semiconductor laser 300 as in the above-described first embodiment.

The cathodes of the light emitting points are connected to the pattern 106 on the substrate 100 via the bump 349, but the pattern is divided into plural electrically separated patterns. The laser driver 200 includes plural independently drivable outputs, and each output is connected to the electrically separated pattern 106. As a result, it is possible to establish connection to different laser driver outputs depending on the light emitting point.

As described above, according to the third embodiment of the present technique, the output to be driven by the laser driver can be selected, making it possible to selectively allow only a specific light emitting point to emit light.

4. Fourth Embodiment

In the above-described first embodiment, when the distance between the power supply and the ground becomes long, there is a possibility that inductance is generated therebetween and high-speed modulation is limited. In a fourth embodiment, a decoupling capacitor is provided between the power supply and the ground and driven to enable high-speed modulation.

Figure 20:
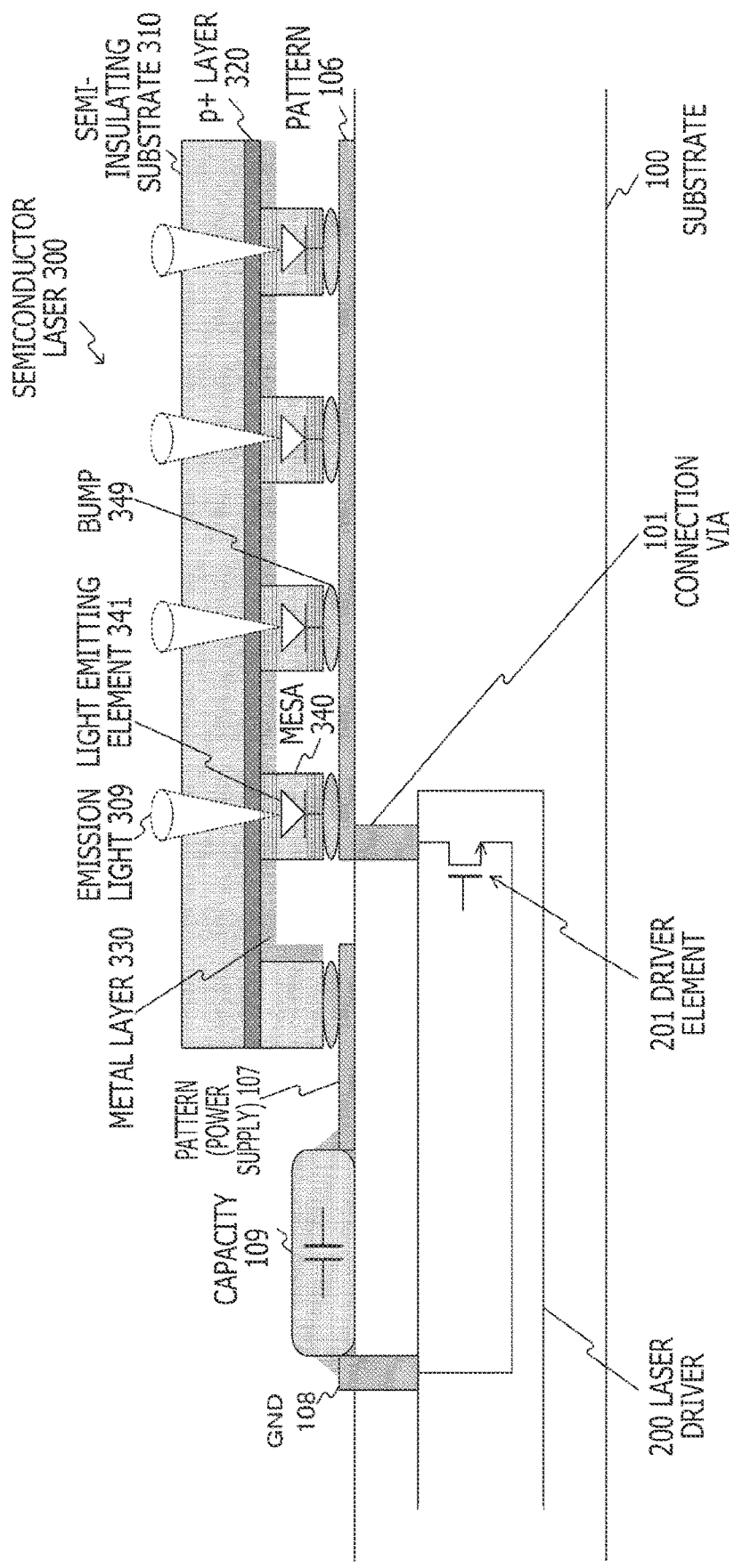
FIG. 20 is a diagram for illustrating a cross-sectional view of a semiconductor laser driving apparatus 10 according to a fourth embodiment of the present technique.

FIG. 20 is a diagram for illustrating an example of a cross-sectional view of a semiconductor laser driving apparatus 10 according to the fourth embodiment of the present technique.

In the third embodiment, a capacity 109 is mounted on the substrate 100 as a decoupling capacitor and is connected to the power supply pattern 107 and the ground (GND) 108 between them.

Figure 21:
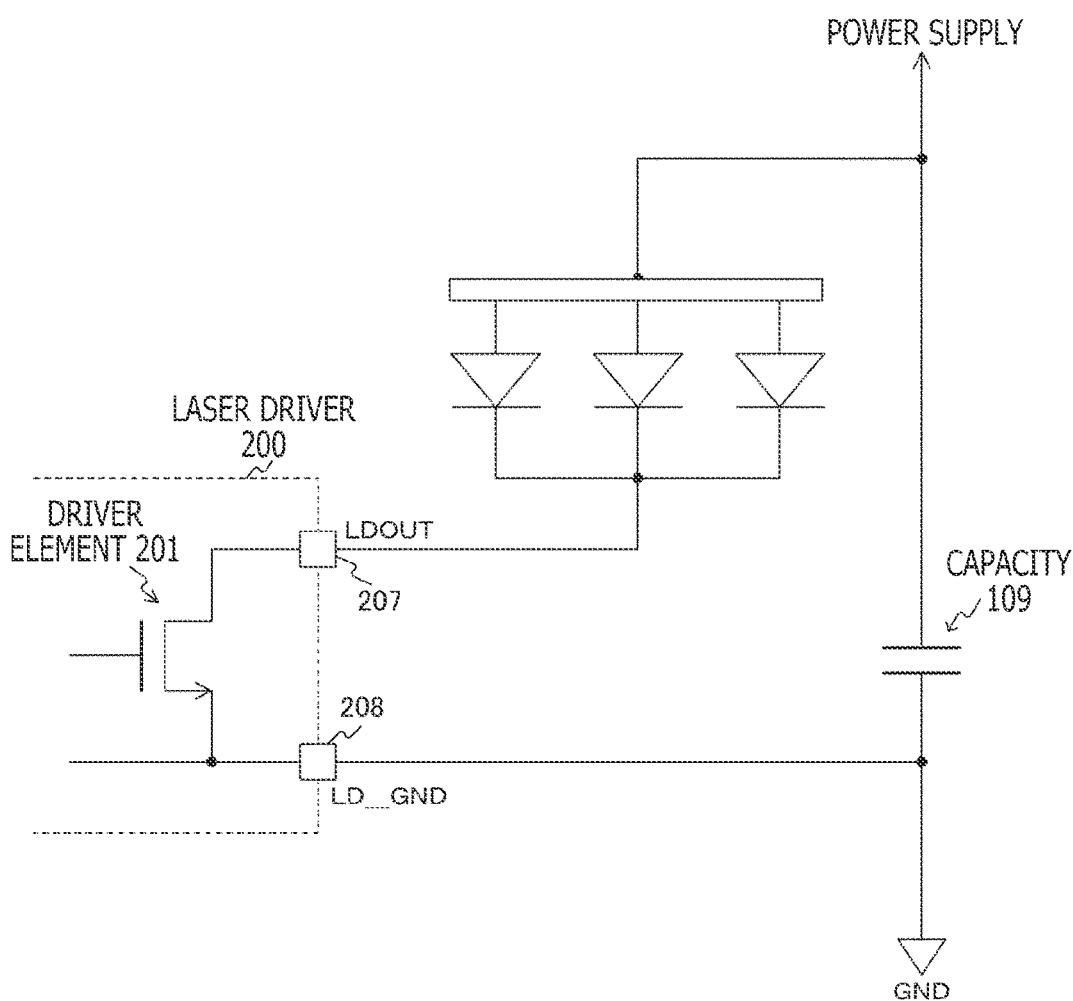
FIG. 21 is a diagram for illustrating an equivalent circuit of the semiconductor laser driving apparatus 10 according to the fourth embodiment of the present technique.

FIG. 21 is a diagram for illustrating an equivalent circuit of the semiconductor laser driving apparatus 10 according to the fourth embodiment of the present technique.

Since the capacity 109 is provided as a decoupling capacitor, the electric charge stored in the capacity 109 can be used as the driving current of the semiconductor laser 300.

As described above, according to the fourth embodiment of the present technique, when the laser is modulated at high speed, the electric charge stored in the capacity 109 mounted in the vicinity of the semiconductor laser 300 becomes the driving current of the semiconductor laser 300, and thus further high-speed modulation can be realized.

5. Modified Example

In the above-described embodiments, an MLA (Micro Lens Array), a DOE (Diffractive Optical Element), or the like may be formed on the light emitting surface of the rear surface emitting-type VCSEL. Accordingly, optical functions can be added without increasing the size of the semiconductor laser driving apparatus 10.

6. Application Example

Electronic Equipment

Figure 22:
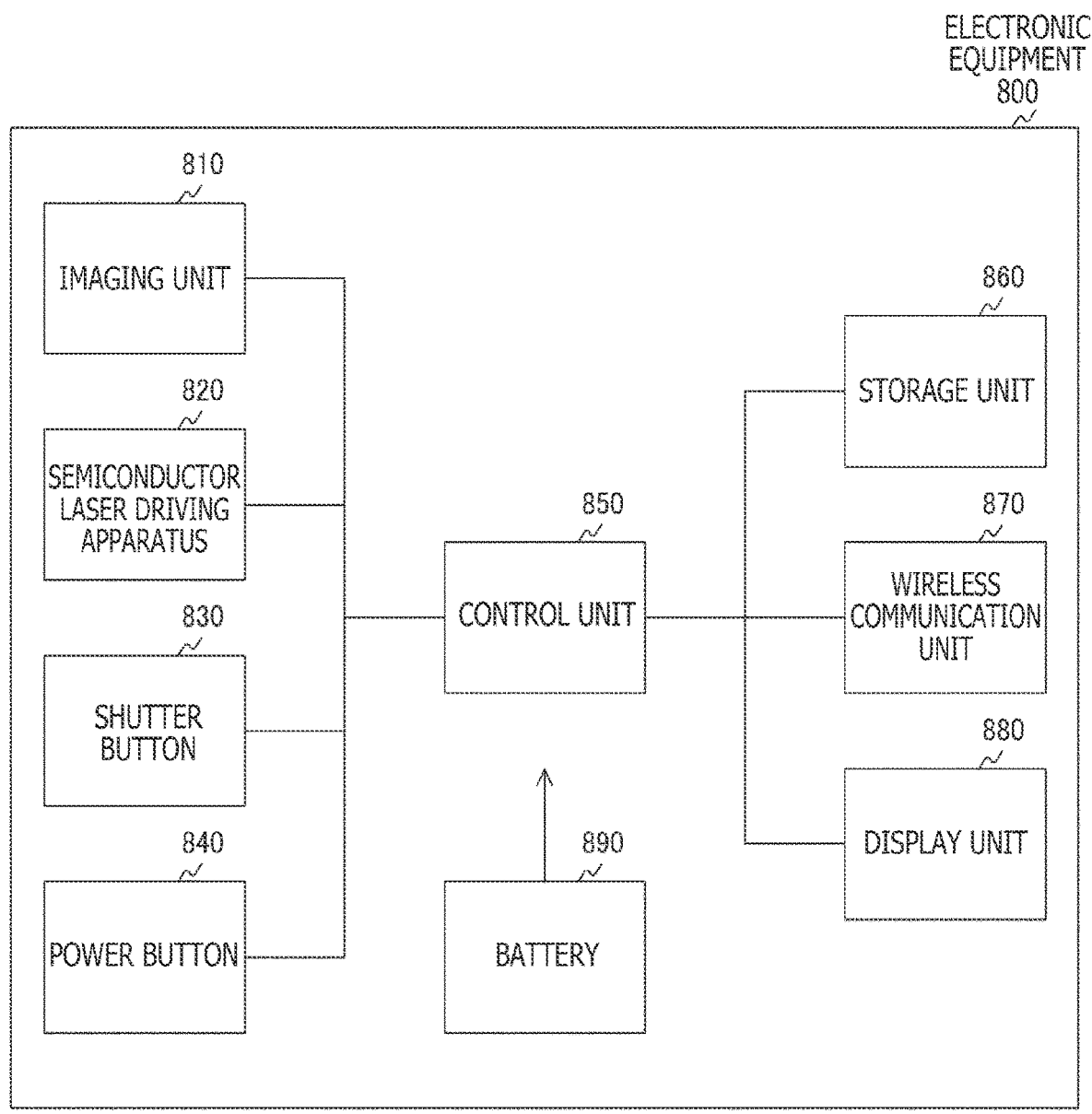
FIG. 22 is a diagram for illustrating a system configuration example of electronic equipment 800 as an application example of the embodiments of the present technique.

FIG. 22 is a diagram for illustrating a system configuration example of electronic equipment 800 as an application example of the embodiments of the present technique.

The electronic equipment 800 is a portable terminal in which the semiconductor laser driving apparatus 10 according to the above-described embodiments is mounted. The electronic equipment 800 includes an imaging unit 810, a semiconductor laser driving apparatus 820, a shutter button 830, a power button 840, a control unit 850, a storage unit 860, a wireless communication unit 870, a display unit 880, and a battery 890.

The imaging unit 810 is an image sensor for imaging a subject. The semiconductor laser driving apparatus 820 is the semiconductor laser driving apparatus 10 according to the above-described embodiments.

The shutter button 830 is a button for giving an instruction on an imaging timing in the imaging unit 810 from the outside of the electronic equipment 800. The power button 840 is a button for giving an instruction on on/off of the power of the electronic equipment 800 from the outside of the electronic equipment 800.

The control unit 850 is a processing unit that controls the entire electronic equipment 800. The storage unit 860 is a memory for storing data and programs necessary for the operation of the electronic equipment 800. The wireless communication unit 870 performs wireless communication with the outside of the electronic equipment 800. The display unit 880 is a display for displaying an image or the like. The battery 890 is a power supply source for supplying power to each unit of the electronic equipment 800.

The imaging unit 810 detects the light receiving amount from 0 to 180 degrees as Q1 and detects the light receiving amount from 180 to 360 degrees as Q2 with a specific phase (for example, rising timing) of a light emission control signal for controlling the semiconductor laser driving apparatus 820 defined as 0 degree. In addition, the imaging unit 810 detects the light receiving amount from 90 to 270 degrees as Q3 and detects the light receiving amount from 270 to 90 degrees as Q4. The control unit 850 computes a distance d to an object by the following equation on the basis of these light receiving amounts Q1 to Q4, and displays the distance d on the display unit 880.

$$d=(c/4\pi f)\times \arctan\{(Q3-Q4)/(Q1-Q2)\}$$

The unit of the distance d in the above equation is, for example, meters (m). In the equation, c is the speed of light, and the unit thereof is, for example, meters per second (m/s). In the equation, arctan is the inverse function of a tangent function. The value of "(Q3−Q4)/(Q1−Q2)" indicates a phase difference between the irradiated light and the reflected light. In the equation, n indicates the ratio of the circumference of a circle to its diameter. In addition, f is the frequency of the irradiated light, and the unit thereof is, for example, megahertz (MHz).

Figure 23:
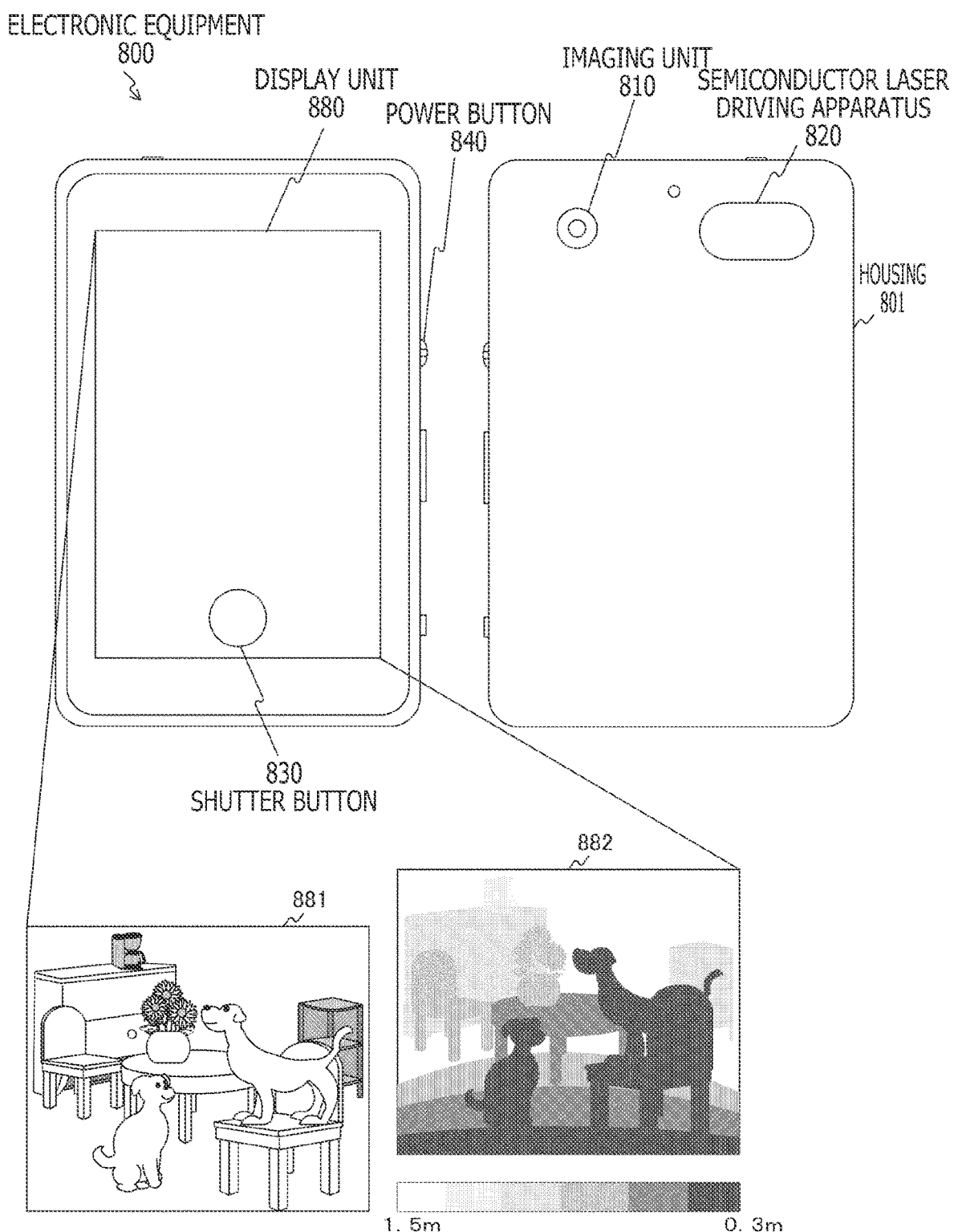
FIG. 23 is a diagram for illustrating an external configuration example of the electronic equipment 800 as an application example of the embodiments of the present technique.

FIG. 23 is a diagram for illustrating an external configuration example of the electronic equipment 800 as an application example of the embodiments of the present technique.

The electronic equipment 800 is housed in a housing 801, includes the power button 840 on a side surface, and includes the display unit 880 and the shutter button 830 on the front surface. In addition, optical regions of the imaging unit 810 and the semiconductor laser driving apparatus 820 are provided on the rear surface.

Accordingly, the display unit 880 can display not only a normal captured image 881 but also a depth image 882 according to the distance measurement result using ToF.

It should be noted that, in the application example, a portable terminal such as a smartphone is exemplified as the electronic equipment 800, but the electronic equipment 800 is not limited thereto, and may be, for example, a digital camera, a game machine, wearable equipment, or the like.

It should be noted that the above-described embodiments illustrate an example for embodying the present technique, and the matters in the embodiments have corresponding relations with the matters specifying the invention in the claims. Similarly, the matters specifying the invention in the claims have corresponding relations with the matters in the embodiments of the present technique to which the same names are given. However, the present technique is not limited to the embodiments, and can be embodied by applying various modifications to the embodiments without departing from the gist thereof.

It should be noted that the effects described in the specification are merely illustrative and not limitative, and other effects may be provided.

It should be noted that the present technique can also be configured as follows.

(1) A semiconductor laser driving apparatus including:

a substrate incorporating a laser driver;

a semiconductor laser that has at least one light emitting point and that is mounted on one surface of the substrate in such a manner that an electrode of the light emitting point and a pattern of the substrate are connected to each other via a bump; and connection wiring that electrically connects the laser driver and the semiconductor laser to each other with a wiring inductance of 0.5 nanohenries or less.

(2) The semiconductor laser driving apparatus according to (1), in which the semiconductor laser is a rear surface emitting-type vertical cavity surface emitting laser that emits light via a substrate material of the semiconductor laser.

(3) The semiconductor laser driving apparatus according to (2), in which the substrate material of the semiconductor laser includes any one of an n-type semiconductor, a p-type semiconductor, or a semi-insulating semiconductor that is not doped with impurities.

(4) The semiconductor laser driving apparatus according to any one of (1) to (3), in which the semiconductor laser includes a metal layer connected to the substrate material on the light emitting point side of the substrate material, and is mounted in such a manner that the metal layer and the pattern of the substrate are connected to each other via a bump.

(5) The semiconductor laser driving apparatus according to any one of (1) to (4), in which a bump that connects the substrate and the semiconductor laser is formed using any one of gold, copper, or solder.

(6) The semiconductor laser driving apparatus according to any one of (1) to (5), in which the semiconductor laser has plural light emitting points where the same anode electrode is used in common.

(7) The semiconductor laser driving apparatus according to any one of (1) to (5), in which the semiconductor laser has plural light emitting points where the same cathode electrode is used in common.

(8) The semiconductor laser driving apparatus according to any one of (1) to (7), in which the substrate includes a capacity for connecting a power supply line and a ground line.

(9) The semiconductor laser driving apparatus according to any one of (1) to (8), in which the laser driver includes plural independently drivable outputs and is connected to the electrode of the light emitting point via plural electrically separated patterns on the substrate to selectively drive a specific light emitting point.

(10) The semiconductor laser driving apparatus according to any one of (1) to (9), in which the connection wiring has a length of 0.5 millimeters or less.

(11) The semiconductor laser driving apparatus according to any one of (1) to (10), in which the connection wiring is provided via a connection via provided in the substrate.

(12) The semiconductor laser driving apparatus according to any one of (1) to (11), in which the semiconductor laser is arranged in such a manner that a part thereof overlaps an upper part of the laser driver.

(13) The semiconductor laser driving apparatus according to (12), in which the semiconductor laser is arranged in such a manner that a part corresponding to 50% or less of an area thereof overlaps the upper part of the laser driver.

(14) Electronic equipment including:

a substrate incorporating a laser driver;

a semiconductor laser that has at least one light emitting point and that is mounted on one surface of the substrate in such a manner that an electrode of the light emitting point and a pattern of the substrate are connected to each other via a bump;

connection wiring that electrically connects the laser driver and the semiconductor laser to each other with a wiring inductance of 0.5 nanohenries or less; and a sealing portion that seals a connection terminal portion of the semiconductor laser for the substrate.

(15) A manufacturing method of a semiconductor laser driving apparatus, comprising:

a step of forming a laser driver on an upper surface of a support plate;

a step of forming a substrate incorporating the laser driver, by forming connection wiring of the laser driver;

a step of, when a semiconductor laser having at least one light emitting point is mounted on one surface of the substrate in such a manner that an electrode of the light emitting point and a pattern of the substrate are connected to each other via a bump, forming connection wiring that electrically connects the laser driver and the semiconductor laser to each other via the connection wiring with a wiring inductance of 0.5 nanohenries or less; and a step of forming a sealing portion that seals a connection terminal portion of the semiconductor laser for the substrate.

REFERENCE SIGNS LIST

10: Semiconductor laser driving apparatus
100: Substrate
101: Connection via
109: Capacity
110: Support plate
120: Adhesive resin layer
130: Peelable copper foil
131: Carrier copper foil
132: Ultra-thin copper foil
140: Solder resist
150: Wiring pattern
161 to 163: Interlayer insulating resin
170 to 172: Via hole
180: Solder resist
200: Laser driver
210: I/O pad
220: Protective insulating layer
230: Surface protective film
240: Adhesion layer and seed layer
250: Photoresist
260: Copper land and copper redistribution layer (RDL)
290: Die attach film (DAF)
300: Semiconductor laser
310: Semi-insulating substrate
311: p-type substrate
312: n-type substrate
320: p+ layer
321: n+ layer
330: Metal layer
340: Mesa
341: Light emitting element
342: Anode
343: Cathode
348, 349: Bump
400: Photodiode
500: Passive component
800: Electronic equipment
801: Housing
810: Imaging unit
820: Semiconductor laser driving apparatus
830: Shutter button
840: Power button
850: Control unit
860: Storage unit
870: Wireless communication unit
880: Display unit
890: Battery

The invention claimed is:

1. A semiconductor laser driving apparatus, comprising:
a substrate incorporating a laser driver;
a semiconductor laser that has at least one light emitting point and that is mounted on one surface of the substrate in such a manner that an electrode of the light emitting point and a pattern of the substrate are connected to each other via a bump; and
connection wiring that electrically connects the laser driver and the semiconductor laser to each other with a wiring inductance of 0.5 nanohenries or less,
wherein the connection wiring is provided between the laser driver and the semiconductor laser such that a length of the connection wiring is contained between a bottom portion of the semiconductor laser and a top portion of the laser driver.

2. The semiconductor laser driving apparatus according to claim 1, wherein the semiconductor laser is a rear surface emitting-type vertical cavity surface emitting laser that emits light via a substrate material of the semiconductor laser.

3. The semiconductor laser driving apparatus according to claim 2, wherein the substrate material of the semiconductor laser includes any one of an n-type semiconductor, a p-type semiconductor, or a semi-insulating semiconductor that is not doped with impurities.

4. The semiconductor laser driving apparatus according to claim 1, wherein the semiconductor laser includes a metal layer connected to the substrate material on the light emitting point side of the substrate material, and is mounted in such a manner that the metal layer and the pattern of the substrate are connected to each other via a bump.

5. The semiconductor laser driving apparatus according to claim 1, wherein a bump that connects the substrate and the semiconductor laser is formed using any one of gold or copper.

6. The semiconductor laser driving apparatus according to claim 1, wherein the semiconductor laser has plural light emitting points where a same anode electrode is used in common.

7. The semiconductor laser driving apparatus according to claim 1, wherein the semiconductor laser has plural light emitting points where a same cathode electrode is used in common.

8. The semiconductor laser driving apparatus according to claim 1, wherein the substrate includes a capacity for connecting a power supply line and a ground line.

9. The semiconductor laser driving apparatus according to claim 1, wherein the laser driver includes plural independently drivable outputs and is connected to the electrode of the light emitting point via plural electrically separated patterns on the substrate to selectively drive a specific light emitting point.

10. The semiconductor laser driving apparatus according to claim 1, wherein the connection wiring has a length of 0.5 millimeters or less.

11. The semiconductor laser driving apparatus according to claim 1, wherein the connection wiring is provided via a connection via provided in the substrate.

12. The semiconductor laser driving apparatus according to claim 1, wherein the semiconductor laser is arranged in such a manner that a part thereof overlaps an upper part of the laser driver.

13. The semiconductor laser driving apparatus according to claim 12, wherein the semiconductor laser is arranged in such a manner that a part corresponding to 50% or less of an area thereof overlaps the upper part of the laser driver.

14. Electronic equipment, comprising:
a substrate incorporating a laser driver;
a semiconductor laser that has at least one light emitting point and that is mounted on one surface of the substrate in such a manner that an electrode of the light emitting point and a pattern of the substrate are connected to each other via a bump;
connection wiring that electrically connects the laser driver and the semiconductor laser to each other with a wiring inductance of 0.5 nanohenries or less,
wherein the connection wiring is provided between the laser driver and the semiconductor laser such that a length of the connection wiring is contained between a bottom portion of the semiconductor laser and a top portion of the laser driver; and
a sealing portion that seals a connection terminal portion of the semiconductor laser for the substrate.

15. A manufacturing method of a semiconductor laser driving apparatus, comprising:
a step of forming a laser driver on an upper surface of a support plate;
a step of forming a substrate incorporating the laser driver, by forming connection wiring of the laser driver;
a step of, when a semiconductor laser having at least one light emitting point is mounted on one surface of the substrate in such a manner that an electrode of the light emitting point and a pattern of the substrate are connected to each other via a bump, forming connection wiring that electrically connects the laser driver and the semiconductor laser to each other via the connection wiring with a wiring inductance of 0.5 nanohenries or less,
wherein the connection wiring is provided between the laser driver and the semiconductor laser such that a length of the connection wiring is contained between a bottom portion of the semiconductor laser and a top portion of the laser driver; and
a step of forming a sealing portion that seals a connection terminal portion of the semiconductor laser for the substrate.

16. A semiconductor laser driving apparatus, comprising:
a substrate incorporating a laser driver;
a semiconductor laser that has plural light emitting elements and that is mounted on a surface facing the substrate so as to be electrically connected to the laser driver via plural bumps; and
connection wiring that electrically connects the laser driver and the semiconductor laser to each other,
wherein the connection wiring is provided between the laser driver and the semiconductor laser such that a length of the connection wiring is contained between a bottom portion of the semiconductor laser and a top portion of the laser driver.

17. The semiconductor laser driving apparatus according to claim 16, wherein the laser driver includes plural independently drivable outputs and is connected to the semiconductor laser via plural electrically separated patterns on the substrate.

18. The semiconductor laser driving apparatus according to claim 16, wherein the semiconductor laser is a rear surface emitting-type vertical cavity surface emitting laser that emits light via a substrate material of the semiconductor laser.

19. The semiconductor laser driving apparatus according to claim 16, wherein the semiconductor laser has plural light emitting elements where a same anode electrode is used in common.

20. The semiconductor laser driving apparatus according to claim 16, wherein the semiconductor laser has plural light emitting elements where a same cathode electrode is used in common.

* * * * *